United States Patent
Zhang et al.

(10) Patent No.: US 12,382,847 B2
(45) Date of Patent: Aug. 5, 2025

(54) RESISTIVE RANDOM-ACCESS MEMORY DEVICES WITH MULTI-COMPONENT ELECTRODES AND DISCONTINUOUS INTERFACE LAYERS

(71) Applicant: TetraMem Inc., Newark, CA (US)

(72) Inventors: Minxian Zhang, Newark, CA (US); Ning Ge, Newark, CA (US)

(73) Assignee: TetraMem Inc., San Jose, CA (US)

( * ) Notice: Subject to any disclaimer, the term of this patent is extended or adjusted under 35 U.S.C. 154(b) by 770 days.

(21) Appl. No.: 17/454,914

(22) Filed: Nov. 15, 2021

(65) Prior Publication Data
US 2022/0077389 A1   Mar. 10, 2022

Related U.S. Application Data

(63) Continuation-in-part of application No. PCT/US2021/040389, filed on Jul. 3, 2021, and a
(Continued)

(51) Int. Cl.
*H10N 70/00* (2023.01)
*H10B 63/00* (2023.01)

(52) U.S. Cl.
CPC ......... *H10N 70/841* (2023.02); *H10B 63/30* (2023.02); *H10B 63/80* (2023.02); *H10N 70/021* (2023.02); *H10N 70/8833* (2023.02)

(58) Field of Classification Search
CPC ...... H10B 63/30; H10B 63/80; H10N 70/021; H10N 70/8833
See application file for complete search history.

(56) References Cited

U.S. PATENT DOCUMENTS

| | | |
|---|---|---|
| 8,658,511 B1 | 2/2014 | Fulgenico et al. |
| 9,691,979 B2 | 6/2017 | Chang et al. |
| | (Continued) | |

FOREIGN PATENT DOCUMENTS

| | | |
|---|---|---|
| CN | 115605073 A | 1/2023 |
| JP | 201279930 A | 4/2012 |
| | (Continued) | |

OTHER PUBLICATIONS

Ellingham Diagrams, MIT (Year: 2013).*
(Continued)

*Primary Examiner* — Shih Tsun A Chou
(74) *Attorney, Agent, or Firm* — JAFFERY WATSON HAMILTON & DESANCTIS LLP

(57) ABSTRACT

The present disclosure relates to resistive random-access memory (RRAM) devices. An RRAM device may include a first electrode, a first interface layer fabricated on the first electrode; a switching oxide layer fabricated on the first interface layer; and a second electrode fabricated on the switching oxide layer. The switching oxide layer includes a transition metal oxide. The first interface layer includes a discontinuous film of a first material that is more chemically stable than the transition metal oxide. The RRAM device may further include a second interface layer positioned between the switching oxide layer and the second electrode. The second interface layer includes a discontinuous film of a second material that is more chemically stable than the transition metal oxide. The second electrode may include multiple electrode components that may include an alloy, a first layer of a first metallic material, and/or a second layer of a second metallic material.

17 Claims, 30 Drawing Sheets

Related U.S. Application Data continuation-in-part of application No. 17/319,068, filed on May 12, 2021, and a continuation-in-part of application No. 17/319,057, filed on May 12, 2021, now Pat. No. 12,213,390, and a continuation-in-part of application No. 16/921,926, filed on Jul. 6, 2020, now Pat. No. 11,527,712.

(56) References Cited

U.S. PATENT DOCUMENTS

| | | |
|---|---|---|
| 11,527,712 B2 | 12/2022 | Zhang et al. |
| 11,793,095 B2 | 10/2023 | Hsu et al. |
| 2005/0018516 A1 | 1/2005 | Chevallier et al. |
| 2009/0272962 A1 | 11/2009 | Kumar et al. |
| 2010/0243983 A1 | 9/2010 | Chiang et al. |
| 2011/0227028 A1 | 9/2011 | Sekar et al. |
| 2013/0168632 A1* | 7/2013 | Moon .................. H10N 70/041 977/773 |
| 2013/0299763 A1* | 11/2013 | Moon ................ H10N 70/8833 257/1 |
| 2014/0091271 A1 | 4/2014 | Tu |
| 2014/0091272 A1 | 4/2014 | Liao et al. |
| 2014/0241038 A1* | 8/2014 | Terai .................. G11C 13/0069 365/148 |
| 2014/0252295 A1 | 9/2014 | Liao et al. |
| 2014/0252297 A1 | 9/2014 | Chang et al. |
| 2014/0361864 A1 | 12/2014 | Fukuda et al. |
| 2015/0137063 A1 | 5/2015 | Ramaswamy et al. |
| 2015/0137064 A1 | 5/2015 | Kumar et al. |
| 2015/0235698 A1 | 8/2015 | Tsai et al. |
| 2015/0041751 A1 | 12/2015 | Zhang et al. |
| 2015/0357566 A1 | 12/2015 | Wang et al. |
| 2017/0117467 A1* | 4/2017 | Chang .................. H10N 70/063 |
| 2017/0346006 A1 | 11/2017 | Nabatame et al. |
| 2018/0062075 A1 | 3/2018 | Jo et al. |
| 2018/0198064 A1 | 7/2018 | Chiang et al. |
| 2018/0219154 A1 | 8/2018 | Majhi et al. |
| 2020/0343445 A1 | 10/2020 | Strutt |
| 2021/0013407 A1 | 1/2021 | Xiao et al. |
| 2021/0028230 A1 | 1/2021 | Zhang et al. |
| 2021/0066589 A1 | 3/2021 | Zhang et al. |
| 2022/0006008 A1 | 1/2022 | Zhang et al. |
| 2022/0013720 A1 | 1/2022 | Zhang et al. |
| 2022/0140239 A1 | 5/2022 | Su et al. |
| 2022/0367802 A1 | 11/2022 | Zhang et al. |
| 2022/0367803 A1 | 11/2022 | Zhang et al. |
| 2022/0367804 A1 | 11/2022 | Zhang et al. |

FOREIGN PATENT DOCUMENTS

| | | |
|---|---|---|
| JP | 2014022660 A | 2/2014 |
| JP | 2016015397 A | 1/2016 |
| JP | 2018502218 A | 1/2018 |
| TW | 200824046 A | 6/2008 |
| TW | 201349238 A | 12/2013 |
| TW | 201539729 A | 10/2015 |
| TW | 201633576 A | 9/2016 |
| TW | 202228133 A | 7/2022 |
| WO | 2017019068 A1 | 2/2017 |
| WO | 2018057012 A1 | 3/2018 |

OTHER PUBLICATIONS

International Searching Authority (ISA)/US, International Preliminary Report on Patentability for PCT/US2022/029008, mailed Nov. 23, 2023, 7 pages.
International Searching Authority (ISA)/US, International Preliminary Report on Patentability for PCT/US2022/029029, mailed Nov. 23, 2023, 8 pages.
International Searching Authority (ISA)/US, International Search Report for PCT/US23/68679, mailed Oct. 10, 2023, 2 pages.
International Searching Authority (ISA)/US, International Search Report for PCT/US23/68681, mailed Oct. 10, 2023, 2 pages.
International Searching Authority (ISA)/US, Written Opinion for PCT/US23/68679, mailed Oct. 10, 2023, 7 pages.
International Searching Authority (ISA)/US, Written Opinion for PCT/US23/68681, mailed Oct. 10, 2023, 4 pages.
International Searching Authority (ISA)/US, International Search Report for PCT/US2022/029008, mailed Aug. 19, 2022, 8 pages.
International Searching Authority (ISA)/US, International Search Report for PCT/US2022/029029, mailed Aug. 18, 2022, 9 pages.
International Searching Authority (ISA)/US, International Search Report for PCT/US2021/040389, Oct. 13, 2021, 2 pages.
International Patent Application No. PCT/US21/40389, "Written Opinion of the International Searching Authority" mailed Oct. 13, 2021, 6 pages.

\* cited by examiner

RESISTIVE RANDOM-ACCESS MEMORY DEVICES WITH MULTI-COMPONENT ELECTRODES AND DISCONTINUOUS INTERFACE LAYERS

CROSS-REFERENCE TO RELATED APPLICATIONS

This application is a continuation-in-part of U.S. patent application Ser. No. 17/319,053, entitled "Resistive Random-Access Memory Devices with Multi-Component Electrodes," filed May 12, 2021, U.S. patent application Ser. No. 17/319,068, entitled "Resistive Random-Access Memory Devices with Multi-Component Electrodes," filed May 12, 2021, PCT Application No. PCT/US21/40389, entitled "Resistive Random-Access Memory Devices with Multi-Component Electrodes," filed Jul. 3, 2021, and U.S. patent application Ser. No. 16/921,926, entitled "Low Current RRAM-Based Crossbar Array Circuits Implemented with Interface Engineering Technologies," filed Jul. 6, 2020, each of which is incorporated herein in its entirety.

TECHNICAL FIELD

The implementations of the disclosure relate generally to resistive random-access memory (RRAM) devices and, more specifically, to RRAM devices with multi-component electrodes and discontinuous interface films.

BACKGROUND

A resistive random-access memory (RRAM) device is a two-terminal passive device with tunable and non-volatile resistance. The resistance of the RRAM device may be electrically switched between a high-resistance state (HRS) and a low-resistance state (LRS) by applying suitable programming signals to the RRAM device. RRAM devices may be used to form crossbar arrays that may be used to implement in-memory computing applications, non-volatile solid-state memory, image processing applications, neural networks, etc.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to one or more aspects of the present disclosure, a resistive random-access memory (RRAM) device may include a first electrode, a first interface layer fabricated on the first electrode, a switching oxide layer fabricated on the first interface layer, and a second electrode fabricated on the switching oxide layer. The first interface layer may include a first discontinuous film of a first material. The switching oxide layer may include at least one transition metal oxide. In some embodiments, the first material is more chemically stable than the at least one transition metal oxide.

In some embodiments, the at least one transition metal oxide includes at least one of $HfO_x$ or $TaO_y$, wherein $x \leq 2.0$, and wherein $y \leq 2.5$.

In some embodiments, the first material includes at least one of $Al_2O_3$, $MgO$, $Y_2O_3$, or $La_2O_3$.

In some embodiments, the first discontinuous film of the first material may include one or more first pores, where the switching oxide layer contacts at least a portion of the first electrode through at least one of the first pores.

In some embodiments, a thickness of the first interface layer is between 0.2 nm and 1 nm.

In some embodiments, the second electrode may include an alloy of tantalum. The alloy of tantalum may further include at least one of hafnium, molybdenum, tungsten, niobium, or zirconium. The alloy of tantalum may include at least one of a binary alloy may include tantalum, a ternary alloy may include tantalum, a quaternary alloy may include tantalum, a quinary alloy may include tantalum, a senary alloy may include tantalum, or a high order alloy may include tantalum.

In some embodiments, the RRAM device further includes a second interface layer including a second discontinuous film of a second material. The second material is more chemically stable than the at least one transition metal oxide. The second electrode contacts at least a portion of the switching oxide layer.

In some embodiments, the second material may include at least one of $Al_2O_3$, $MgO$, $Y_2O_3$, or $La_2O_3$.

In some embodiments, a thickness of the second interface layer is between 0.2 nm and 1 nm.

In some embodiments, the second electrode may include: a first layer may include a first metallic material and a second layer including a second metallic material. The first layer is fabricated on the switching oxide layer. The second layer is fabricated on the first layer. The first material is more chemically stable than an oxide of the first metallic material. The oxide of the first metallic material is more chemically stable than the at least one transition metal oxide. In some embodiments, the first metallic material in the second electrode comprises at least one of Ti, Hf, or Zr. In some embodiments, the second metallic material in the second electrode may include tantalum.

In some embodiments, a thickness of the first layer including the first metallic material is between 0.2 nm and 5 nm.

One or more aspects of the present disclosure provides a method for fabricating a resistive random-access memory (RRAM) device. The method includes fabricating, on a first electrode of the RRAM device, a first interface layer including a first discontinuous film of a first material. The method also includes fabricating, on the first interface layer, a switching oxide layer including at least one transition metal oxide. The first material is more chemically stable than the at least one transition metal oxide. The method also includes fabricating, on the switching oxide layer, a second interface layer including a second discontinuous film of a second material, where the second material is more chemically stable than the at least one transition metal oxide. The method also includes fabricating, on the second interface layer, a second electrode.

In some embodiments, the first discontinuous film of the first material may include one or more pores. Fabricating, on the first interface layer, the switching oxide layer may include depositing the at least one transition metal oxide on the first electrode through one or more of the pores. Fabricating on the first electrode of the RRAM device, the first interface layer may include depositing the first material on the first electrode to form the first discontinuous film.

According to one or more aspects of the present disclosure, an RRAM device may include the first electrode, the first interface layer fabricated on the first electrode, the switching oxide layer fabricated on the first interface layer, the second interface layer fabricated on the switching oxide layer, and the second electrode fabricated on the switching oxide layer.

According to one or more aspects of the present disclosure, an RRAM device may include a first electrode, a switching oxide layer fabricated on the first electrode, an interface layer fabricated on the switching oxide layer, and a second electrode fabricated on the interface layer. The switching oxide layer may include at least one transition metal oxide. The interface layer may include a discontinuous film of a material that is more chemically stable than the at least one transition metal oxide.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

DETAILED DESCRIPTION

Figure 1:
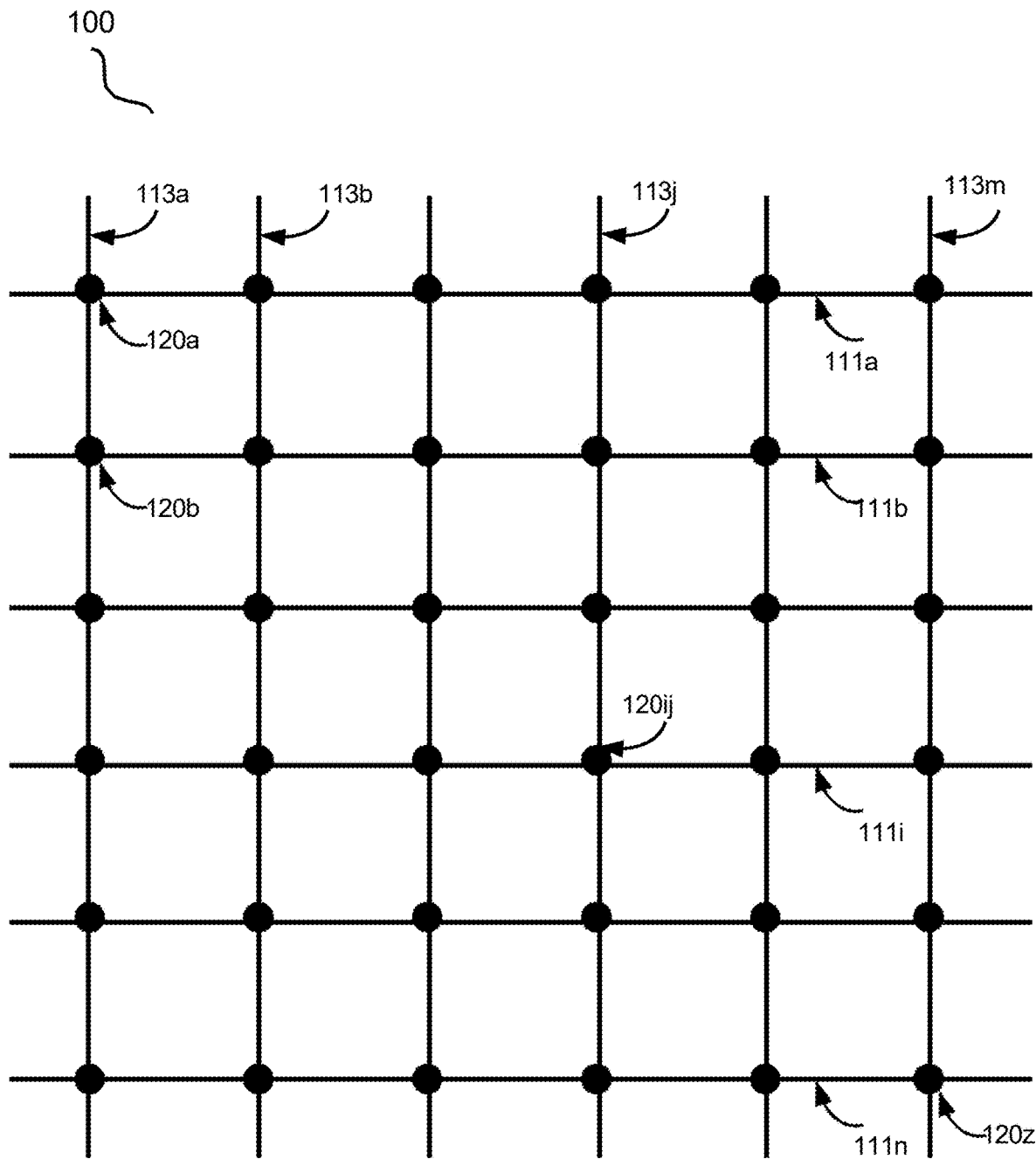
FIG. 1 is a schematic diagram illustrating an example of a crossbar circuit in accordance with some implementations of the disclosure.

Aspects of the disclosure provide resistive random-access memory (RRAM) devices and methods for fabricating the RRAM devices. An RRAM device is a two-terminal passive device with tunable resistance. The RRAM device may include a first electrode, a second electrode, and a switching oxide layer positioned between the first electrode and the second electrode. The first electrode may include a nonreactive metal, such as platinum (Pt), palladium (Pd), etc. The second electrode may include a reactive metal, such as tantalum (Ta). The electrode including the nonreactive metal is also referred to herein as the "nonreactive electrode." The electrode including the reactive metal is also referred to herein as the "reactive electrode." The switching oxide layer may include a transition metal oxide, such as hafnium oxide ($HfO_x$) or tantalum oxide ($TaO_x$). The RRAM device may be in an initial state or virgin state and may have an initial high resistance before it is subject to a suitable electrical stimulation (e.g., a voltage or current signal applied to the RRAM device). The RRAM device may be tuned to a lower resistance state from the virgin state via a forming process or from a high-resistance state (HRS) to a lower resistance state (LRS) via a setting process. The forming process may refer to programming a device starting from the virgin state. The setting process may refer to programming a device starting from the high resistance state (HRS). After the reactive metal electrode is deposited on the switching oxide, the reactive metal can absorb oxygen from the switching oxide layer and create oxygen vacancies in the switching oxide layer, and oxygen ions can migrate in the switching oxide through a vacancy mechanism. During a forming process, a suitable programming signal (e.g., a voltage or current signal) may be applied to the RRAM device, which may cause a drift of oxygen ions to migrate from the switching oxide to the reactive electrode. As a result, a conductive channel or filament may form through the switching oxide layer (e.g., from the reactive electrode to the non-reactive electrode). The RRAM device may then be reset to a high-resistance state by applying a reset signal (e.g., a voltage signal, a current signal) to the RRAM device. The application of the reset signal to the RRAM device may cause oxygen to migrate back to the switching oxide layer and may thus interrupt the conductive filament. The RRAM device may be electrically switched between a high-resistance state and a low-resistance state by applying suitable programming signals (e.g., voltage signals, current signals, etc.) to the RRAM device. In a crossbar array circuit, the programming signals may be provided to the designated RRAM device via a selector, such as a transistor.

It might be desirable to scale down RRAM devices to a suitable size (e.g., a critical dimension of 100 nm, 10 nm, or a smaller dimension) to implement certain in-memory computing (IMC) applications (e.g., an IMC application that requires high density RRAM devices and/or low-power consumption). However, when the critical dimension of a conventional RRAM device scales down, the filament formed in the conventional RRAM device may not scale down accordingly. For example, the size of the filament formed in the scaled-down RRAM device may not be scaled-down proportionally. As such, forming, setting, and/or resetting such a conventional scaled-down RRAM device may still require a relatively high current or voltage. This may also prevent the effective scaling down of the selector (e.g., a transistor) and/or the integrated circuit that provides the current or voltage to the scaled-down RRAM device. Furthermore, the scaled-down RRAM device may have a relatively smaller area of top electrode. The top electrode may not be able to absorb as much oxygen as that of a larger RRAM device. This may cause device failures and/or operation failures of the RRAM device. For example, a device failure can be caused by delamination between the reactive electrode and the switching oxide by the presence of oxygen molecules. As another example, the oxygen ions may drift from the switching oxide into the top electrode under an external voltage and may migrate back to the switching oxide once the external voltage is removed, resulting in the operation to be volatile which is an operation failure for non-volatile memory.

To address the aforementioned and other deficiencies of the conventional RRAM devices, the present disclosure provides RRAM devices with multi-component electrode structures, multi-layer electrode structure, and interface layers that may enhance the performance of the RRAM devices and implement low-power IMC applications. In some embodiments, an RRAM device may include a bottom electrode, a first interface layer fabricated on the bottom electrode, a switching oxide layer fabricated on the first interface layer, and a top electrode fabricated on the switching oxide layer. The bottom electrode may include Pt or any other suitable nonactive metal. The switching oxide layer may include a transition metal oxide, such as $HfO_x$, $TaO_x$, $TiO_x$, $NbO_x$, $ZrO_x$, etc. The first interface layer may include a discontinuous film of a first material that is more chemically stable than the transition metal oxide. The first material may include, for example, $Al_2O_3$, MgO, $Y_2O_3$, $La_2O_3$, etc. The incorporation of the first interface layer may reduce the contact area between the switching oxide layer and the first electrode, resulting in a less abrupt forming process, reduce the forming voltage, reduce the reset current, and reduce voltage and/or current requirements in subsequent operation processes. For example, the first electrode and the switching oxide may be in full direct contact without the presence of the first interface layer. The first electrode does not directly contact the switching oxide with the presence of a continuous first interface layer between the first electrode and the switching oxide. In contrast, the first electrode and the switching oxide are in reduced or controlled direct contact with the presence of a non-continuous first interface layer between the first electrode and the switching oxide.

In some implementations, the RRAM device may further include a second interface layer fabricated on the switching oxide layer. In such implementations, the top electrode may be fabricated on the second interface layer. The second interface layer may include a discontinuous film of a second material that is more chemically stable than the transition metal oxide. The incorporation of the second interface layer may reduce the contact area between the switching oxide layer and the top electrode.

In some embodiments, the top electrode may include one or more multi-component electrode structures. For example, the top electrode may include one or more alloys of Ta in one implementation. The alloys of Ta may be and/or include a binary alloy containing Ta, a ternary alloy containing Ta, a quaternary alloy containing Ta, a quinary alloy containing Ta, a senary alloy containing Ta, and/or a high order alloy (e.g., an alloy containing more than six metallic elements) containing Ta. Each of the alloys may include Ta and one or more other metallic elements that have required thermodynamic and/or kinetic properties than Ta, such as tungsten (W), hafnium (Hf), molybdenum (Mo), niobium (Nb), zirconium (Zr), etc. For example, fabricating the top electrode using an alloy of Ta instead of pure Ta metal may reduce the migration of Ta into the switching oxide layer during the forming process and may thus reduce the size of the filament formed in the switching oxide layer (e.g., by reducing the lateral dimension or diameter of the filament). This may increase the filament resistance of the RRAM device and may thus increase the resistance of the RRAM device in both the low-resistance state and the high-resistance state, which may thus reduce the voltage and/or current required for operations of the RRAM device, such as forming, setting, resetting, and/or tuning the RRAM device. The RRAM device incorporating the multi-component electrode structure may present dynamic memristive behavior in multiple dimensions suitable for implementing dynamic learning, edge processing, inference engine accelerators, and other IMC applications.

In another implementation, the top electrode may include multiple layers of different metallic materials. For example, the top electrode may include a layer of titanium (Ti) and a layer of tantalum (Ta). The layer of Ti may be much thinner than the layer of Ta. For example, a thickness of the layer of Ti may be between about 0.2 nm and 5 nm. A thickness of the layer of Ta may be about 50 nm. In some embodiments, the thickness of the layer of Ti may be between 0.3 nm and 2 nm. Both Ti and Ta may trap and release oxygen during device operations. The incorporation of the thin Ti layer into the RRAM device may change the virgin resistance of the RRAM device, result in a less abrupt forming process, reduce the forming voltage, reduce the reset current, and reduce voltage and/or current requirements in subsequent operation processes.

Accordingly, the present disclosure provides techniques for fabricating RRAM devices with high filament resistance and reduced operation voltages and currents. The RRAM devices also present desirable linearity, analog, retention, and endurance etc. behaviors for IMC applications. The incorporation of the first interface layer and/or the second interface layer may reduce the contact between the switching oxide layer and the bottom electrode and/or the contact between the switching oxide layer and the top electrode. The techniques may enable efficient scaling down of RRAM devices and low-power consumption IMC applications utilizing RRAM devices.

FIG. 1 is a schematic diagram illustrating an example 100 of a crossbar circuit in accordance some embodiments of the present disclosure. As shown, crossbar circuit 100 may include a plurality of interconnecting electrically conductive wires, such as one or more row wires 111a, 111b, ..., 111i, ..., 111n, and column wires 113a, 113b, ..., 113j, ..., 113m for an n-row by m-column crossbar array. The crossbar circuit 100 may further include cross-point devices 120a, 120b, ..., 120z, etc. Each of the cross-point devices may connect a row wire and a column wire. For example, the cross-point device 120ij may connect the row wire 111i and the column wire 113j. In some embodiments, crossbar circuit 100 may further include digital to analog converters (DAC, not shown), analog to digital converters (ADC, not shown), switches (not shown), and/or any other suitable circuit components for implementing a crossbar-based apparatus. The number of the column wires 113a-m and the number of the row wires 111a-n may or may not be the same.

Row wires 111 may include a first row wire 111a, a second row wire 111b, ..., 111i, ..., and a n-th row wire 111n. Each of row wires 111a, ..., 111n may be and/or include any suitable electrically conductive material. In some embodiments, each row wire 111a-n may be a metal wire.

Column wires 113 may include a first column wire 113a, a second column wire 113b, . . . , and an m-th column wire 113m. Each of column wires 113a-m may be and/or include any suitable electrically conductive material. In some embodiments, each column wire 113a-m may be a metal wire.

Each cross-point device 120 may be and/or include any suitable device with tunable resistance, such as a memristor, pulse-code modulation (PCM) devices, floating gates, spintronic devices, RRAM, static random-access memory (SRAM), etc. In some embodiments, one or more of cross-point devices 120 may include an RRAM device as described in connection with FIGS. 3A-5B.

Crossbar circuit 100 may perform parallel weighted voltage multiplication and current summation. For example, an input voltage signal may be applied to one or more rows of crossbar circuit 100 (e.g., one or more selected rows). The input signal may flow through the cross-point devices of the rows of the crossbar circuit 100. The conductance of the cross-point device may be tuned to a specific value (also referred to as a "weight"). By Ohm's law, the input voltage multiplies the cross-point conductance generates a current form the cross-point device. By Kirchhoff's law, the summation of the current passing the devices on each column generates the current as the output signal, which may be read from the columns (e.g., outputs of the ADCs). According to Ohm's law and Kirchhoff's current law, the input-output relationship of the crossbar array can be represented as I=VG, wherein I represents the output signal matrix as current; V represents the input signal matrix as voltage; and G represents the conductance matrix of the cross-point devices. As such, the input signal is weighted at each of the cross-point devices by its conductance according to Ohm's law. The weighted current is outputted via each column wire and may be accumulated according to Kirchhoff's current law. This may enable in-memory computing (IMC) via parallel multiplications and summations performed in the crossbar arrays.

Figure 2:
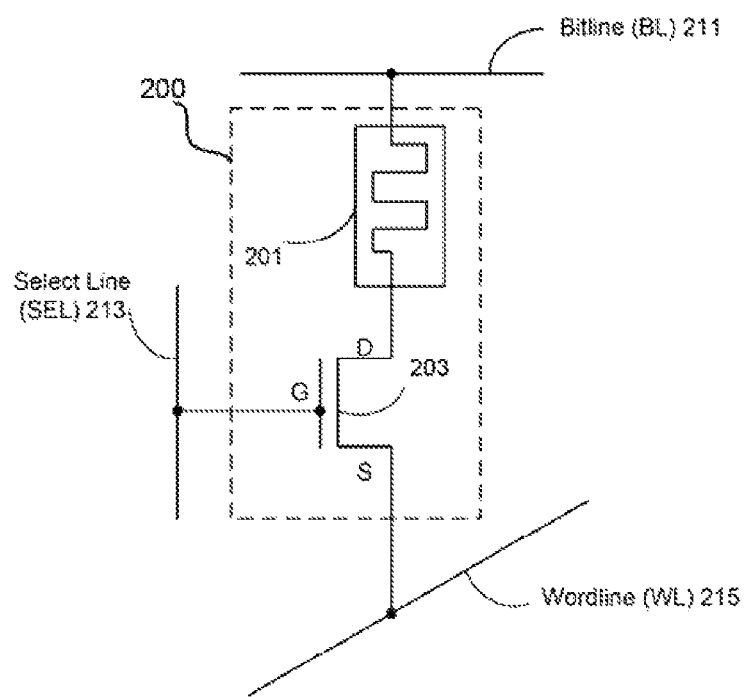
FIG. 2 is a schematic diagram illustrating an example of a cross-point device in accordance with some implementations of the disclosure.

FIG. 2 is a schematic diagram illustrating an example 200 of a cross-point device in accordance some embodiments of the present disclosure. As shown, cross-point device 200 may connect a bitline (BL) 211, a select line (SEL) 213, and a wordline (WL) 215. The bitline 211 and the wordline 215 may be a column wire and a row wire as described in connection with FIG. 1, respectively.

Cross-point device 200 may include an RRAM device 201 and a transistor 203. A transistor is a three-terminal device, which may be marked as gate (G), source(S), and drain (D), respectively. The transistor 203 may be serially connected to RRAM device 201. As shown in FIG. 2, the first electrode of the RRAM device 201 may be connected to the drain of transistor 203. The second electrode of the RRAM device 201 may be connected to the bitline 211. The source of the transistor 203 may be connected to the wordline 215. The gate of the transistor 203 may be connected to the select line 213. RRAM device 201 may include one or more RRAM devices as described in connection with FIGS. 3A-7 below. Cross-point device 200 may also be referred to as in a 1-transistor-1-resistor (1T1R) configuration. The transistor 203 may perform as a selector as well as a current controller, which may set the current compliance, to the RRAM device 201 during programing. The gate voltage on transistor 203 can set current compliances to cross-point device 200 during programming and can thus control the conductance and analog behavior of cross-point device 200.

For example, when cross-point device 200 is set from a high-resistance state to a low-resistance state, a set signal (e.g., a voltage signal, a current signal) may be provided via the bitline (BL) 211. Another voltage, also referred as a select voltage or gate voltage, may be applied via the select line (SEL) 213 to the transistor gate to open the gate and set the current compliance, while the wordline (WL) 215 may be set to ground. When cross-point device 200 is reset from the low-resistance state to the high-resistance state, a gate voltage may be applied to the gate of the transistor 203 via the select line 213 to open the transistor gate. Meanwhile, a reset signal may be sent to the RRAM device 201 via the wordline 215, while the bitline 211 may be set to ground.

Figure 3A:
FIGS. 3A-3C, 4A-4F, 5A-5D, and 6A-6D illustrate cross-sectional views of example RRAM devices in accordance with some embodiments of the present disclosure.
Figure 3B:
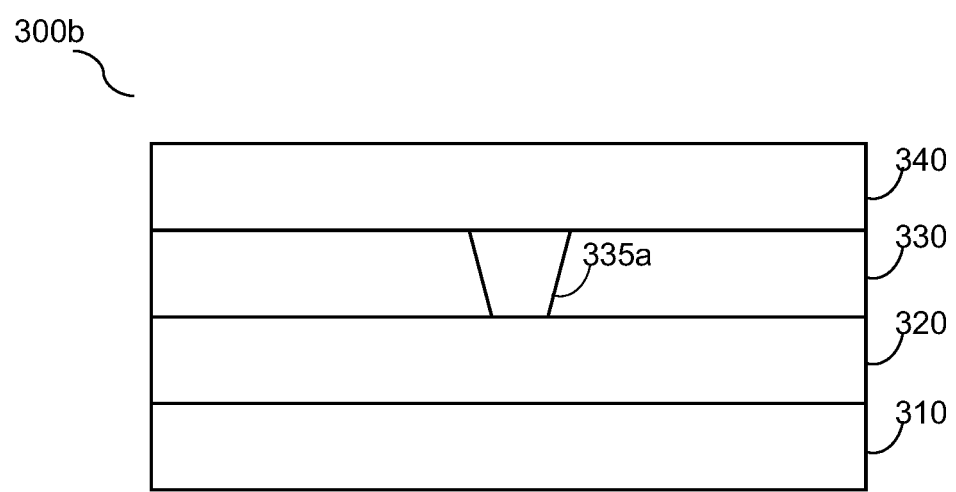
Figure 3C:
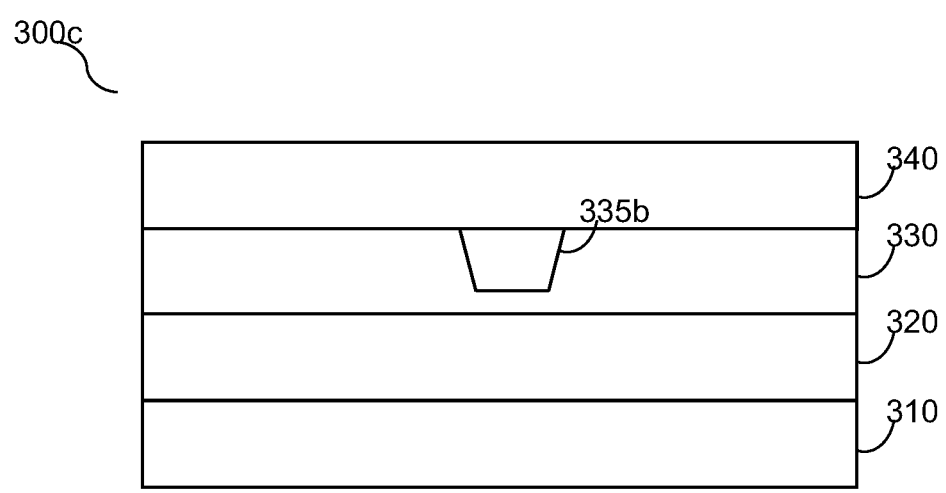

FIGS. 3A, 3B, and 3C illustrate cross-sectional views of example RRAM devices in accordance with some embodiments of the present disclosure. RRAM devices 300a, 300b, and 300c may correspond to an RRAM device in an initial state, a low-resistance state, and a high-resistance state, respectively.

As shown in FIG. 3A, RRAM device 300a may include a substrate 310, a first electrode 320, a switching oxide layer 330, and a second electrode 340. RRAM device 300a may further include one or more other components for implementing in-memory computing applications.

Substrate 310 may include one or more layers of any suitable material that may serve as a substrate for an RRAM device, such as silicon (Si), silicon dioxide ($SiO_2$), silicon nitride ($Si_3N_4$), aluminum oxide ($Al_2O_3$), aluminum nitride (AlN), etc. In some embodiments, substrate 310 may include diodes, transistors, interconnects, integrated circuits, etc. In some embodiments, the substrate may include a driving circuit including one or more electrical circuits (e.g., an array of electrical circuits) that may be individually controllable. In some embodiments, the driving circuit may include one or more complementary metal-oxide-semiconductor (CMOS) drivers.

First electrode 320 may be and/or include any suitable material that is electronically conductive and non-reactive to the switching oxide. For example, first electrode 320 may include platinum (Pt), palladium (Pd), iridium (Ir), titanium nitride (TiN), tantalum nitride (TaN), etc.

Switching oxide layer 330 may include one or more transition metal oxides, such as $TaO_x$, $HfO_x$, $TiO_x$, NbOx, ZrOx, etc., in binary oxides, ternary oxides, and high order oxides. In some embodiments, the chemical stability of the non-reactive material in first electrode 320 may be higher than that of the transition metal oxide(s) in switching oxide layer 330.

Second electrode 340 may include any suitable metallic material that are electronically conductive and reactive to the switching oxide. For example, the metallic material in second electrode 340 may include Ta, Hf, Ti, TiN, TaN, etc. Second electrode 340 may be reactive to the switching oxide and may have suitable oxygen solubility to adsorb some oxygen from the switching oxide layer 330 and create oxygen vacancies in the switching oxide layer 330. In other words, the reactive metallic material(s) in second electrode 340 may have suitable oxygen solubility and/or oxygen mobility. In some embodiments, second electrode 340 not only may be able to create oxygen vacancies in switching oxide layer 330 (e.g., by scavenging oxygen), but also may function as oxygen reservoir or source to the switching oxide layer 330 during cell programming.

RRAM device 300a may have an initial resistance (also referred to herein as the "virgin resistance") after it is fabricated. The initial resistance of RRAM device 300a may be changed and RRAM device 300a may be switched to a state of a lower resistance via a forming process. For example, a suitable voltage or current may be applied to RRAM device 300a. The application of the voltage to RRAM device 300a may induce the metallic material(s) in the second electrode to absorb oxygen from the switching oxide layer 330 and create oxygen vacancies in the switching oxide layer 330. As a result, a conductive channel (e.g., a filament) which is oxygen vacancy rich may form in the switching oxide layer 330. For example, as illustrated in FIG. 3B, a conductive channel 335a may be formed in the switching oxide layer 330. As shown, conductive channel 335a may be formed from the second electrode 340 to the first electrode 320 across the switching oxide layer 330. RRAM device 300b may be reset to a high-resistance state. For example, a reset signal (e.g., a voltage signal or a current signal) may be applied to RRAM device 300b during a reset process. In some embodiments, the set signal and the reset signal may have opposite polarity, i.e., a positive signal and a negative signal, respectively. The application of the reset signal may cause oxygen to drift back to the switching oxide layer 330 and recombine with one or more of the oxygen vacancies. For example, an interrupted conductive channel 335b as shown in FIG. 3C may be formed in the switching oxide layer 330 during the reset process. As shown, the conductive channel may be interrupted with an oxide gap between the interrupted conductive channel 335b and the first electrode 320. The lateral dimension of conductive channel 335b may be smaller than that of the conductive channel 335a. In some embodiments, conductive channel 335b does not continuously connect the first electrode 320 and the second electrode 340. RRAM device 300a-c may be electrically switched between the high-resistance state and the low-resistance state by applying suitable programming signals (e.g., voltage signals, current signals, etc.) to the RRAM device.

FIGS. 4A-4F are schematic diagrams illustrating cross-sectional views of example structures 400a, 400b, 400c, 400d, 400e, and 400f of RRAM devices in accordance with some embodiments of the present disclosure.

Figure 4A:
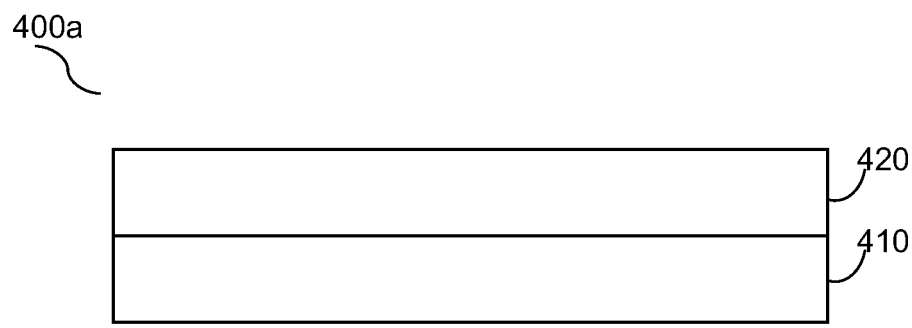

As illustrated FIG. 4A, a first electrode 420 may be fabricated on a substrate 410. The first electrode 420 and the substrate 410 may correspond to the first electrode 320 and the substrate 310 as described in conjunction with FIGS. 3A, 3B, and 3C, respectively.

Figure 4B:
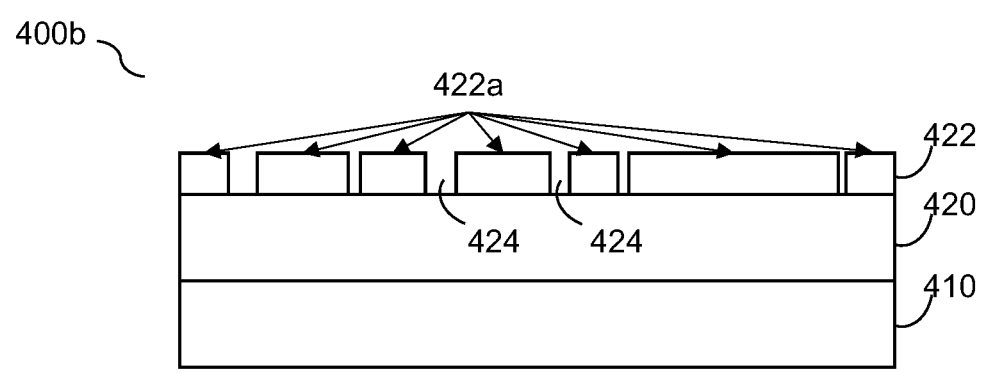

As illustrated FIG. 4B, an interface layer 422 may be fabricated on the first electrode 420. The interface layer 422 (also referred to herein as the "first interface layer") may be and/or include a discontinuous film 422a. For example, the discontinuous film 422a may include one or more pores 424. The pore(s) 424 (also referred to herein as the "first pores") may have any suitable size and/or dimension and may be dispersed randomly on the interface layer 422. While certain number of pores are illustrated in FIG. 4B, this is merely illustrative. The discontinuous film 422a may include any suitable number of pores. In some embodiments, a thickness of the interface layer 422 and/or the discontinuous film 422a may be between about 0.2 nm and about 0.5 nm. In some embodiments, the discontinuous film 422a may be an $Al_2O_3$ film having a thickness equal to or less than 0.5 nm. In some embodiments, the discontinuous film 422a may be and/or include an $Al_2O_3$ film having a thickness less than 1 nm.

Figure 4C:
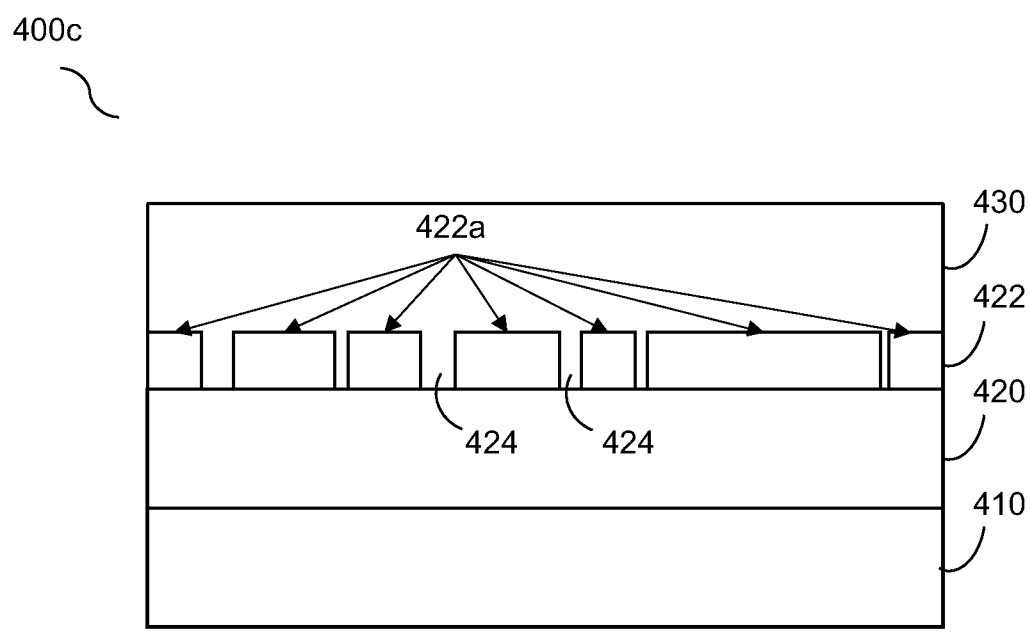

As illustrated in FIG. 4C, a switching oxide layer 430 may be fabricated on the interface layer 422. The switching oxide layer 430 may include one or more transition metal oxides, such as $TaO_x$, $HfO_x$, $TiO_x$, $NbOx$, $ZrOx$, etc., in binary oxides, ternary oxides, and high order oxides, wherein x may be used to indicate the oxide being oxygen deficient compared to its full (or terminal) oxide and the value of x may be varied from the oxygen to metal atomic ratio in the stoichiometry of its full oxide, such as $x \leq 2.0$ for $HfO_x$ (where $HfO_2$ being the full oxide), and $x \leq 2.5$ for $TaO_x$ (where $Ta_2O_5$ being the full oxide). As an example, the switching oxide layer 430 may include $Ta_2O_5$. As the other example, the switching oxide layer 430 may include $HfO_2$.

In some embodiments, during the fabrication of the switching oxide layer 430, one or more portions of the transition metal oxides may be disposed on the first electrode 420 through one or more pores 424. As such, the switching oxide layer 430 may contact one or more portions of the first electrode 420.

In some embodiments, the interface layer 422 may contain a first material that is more chemically stable than the transition metal oxide(s) in the switching oxide layer 430. As a result, the first material may not react with the transition metal oxide(s) of the switching oxide layer 430. The first material may include a metallic element that is univalent. As an example, the switching oxide of the switching oxide layer may be and/or include one or more transition metal oxides, such as at least one of $HfO_x$ or $TaO_y$, wherein $x \leq 2.0$, and wherein $y \leq 2.5$, and the first material may include $Al_2O_3$, $MgO$, $Y_2O_3$, $La_2O_3$, etc.

Figure 8:
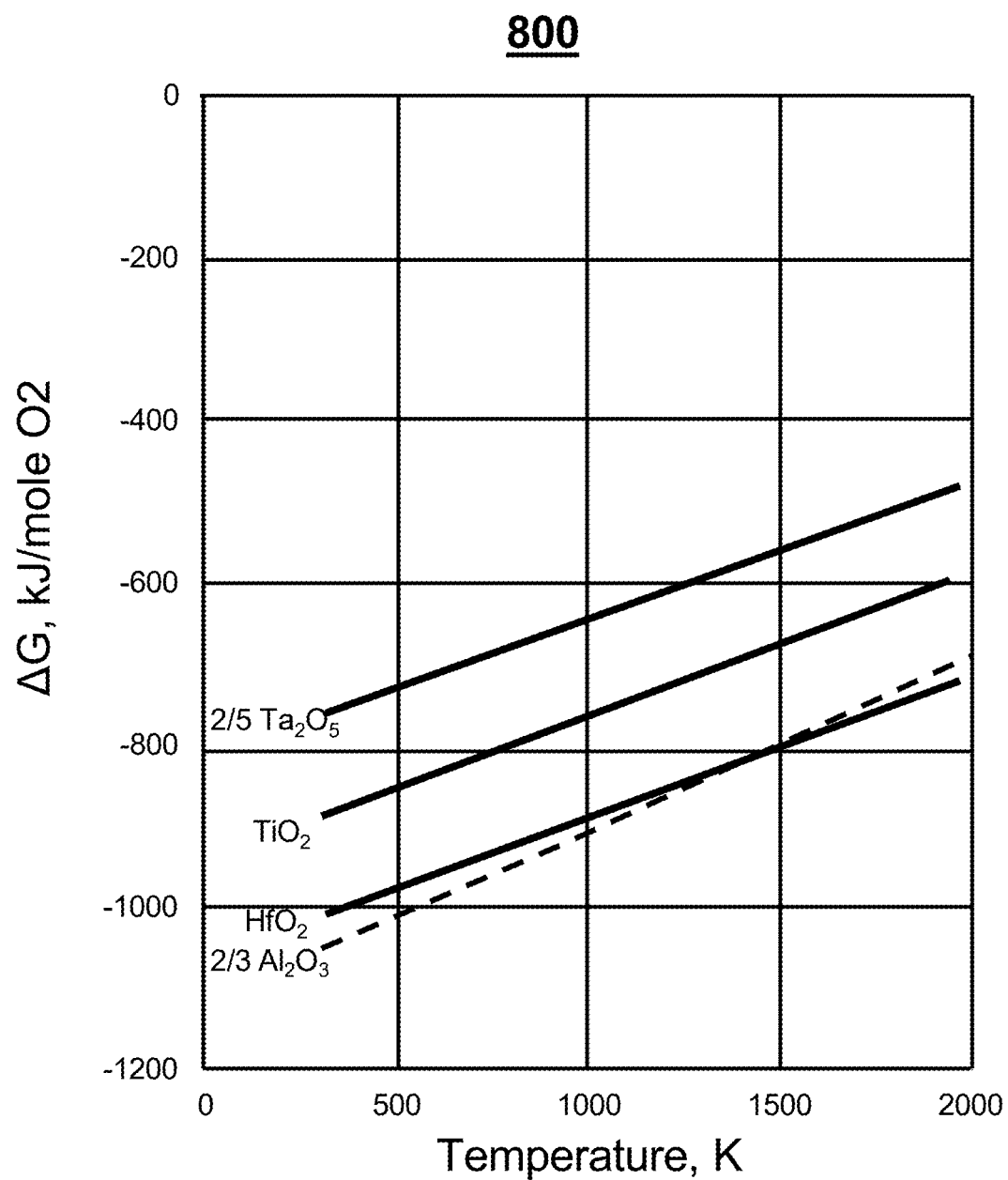
FIG. 8 is an Ellingham diagram showing the chemical stability of metal oxides in accordance with some embodiments of the present disclosure.

Referring to FIG. 8, materials that are more chemically stable than the transition metal oxide(s) in the switching oxide layer 430 may be identified using Ellingham diagrams. As illustrated, an Ellingham diagram 800 plots the Gibbs free energy change for an oxidation reaction as a function of temperature. The chemical stability of the materials may be determined based on the Gibbs formation energy values of the materials. The Gibbs free energy shown on the vertical axis in FIG. 8 may represent the oxide formation energy. The curve of the material of the interface layer 422 may be below the curve corresponding to the transition metal oxide(s) of the switching oxide layer 430. As an example, $Al_2O_3$ may be used as the first material in some embodiments in which the transition metal oxide in the switching oxide layer 430 contains $Ta_2O_5$. The first material containing $Al_2O_3$ does not react with the transition metal oxide containing $Ta_2O_5$ during the setting process and resetting process.

Figure 4D:
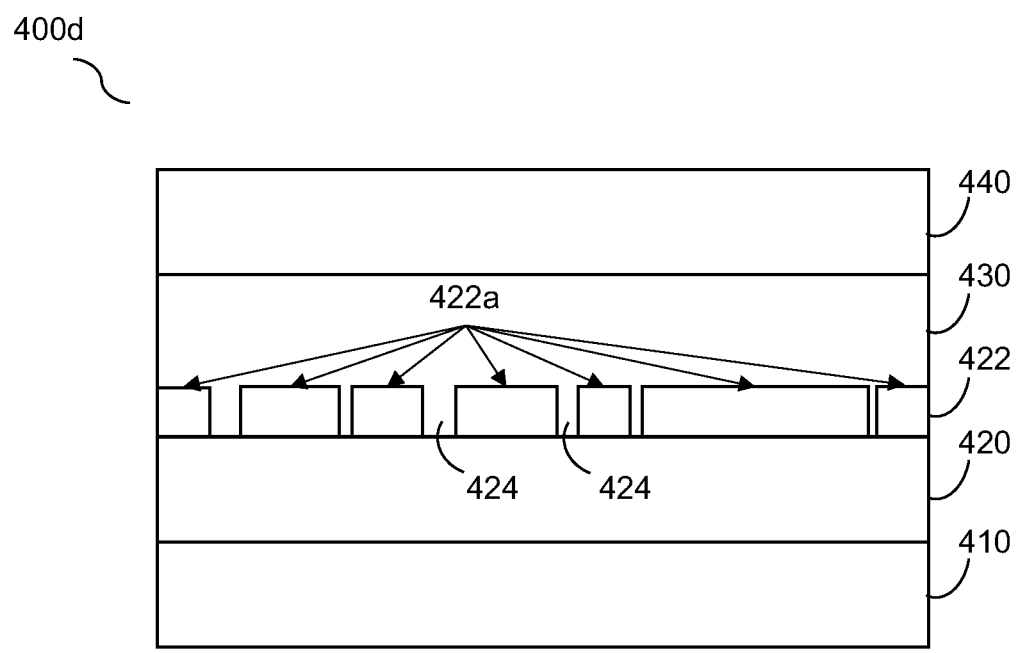

As shown in FIG. 4D, a second electrode 440 may be fabricated on the switching oxide layer 430. In some embodiments, the second electrode 440 may include one or more top electrodes 700 as described in connection with FIG. 7. In some embodiments, the second electrode 440 fabricated on the switching oxide layer 430 may include one or more alloys. Each of the alloys may contain two or more metallic elements. Each of the alloys may include a binary alloy (e.g., an alloy containing two metallic elements), a ternary alloy (e.g., an alloy containing three metallic elements), a quaternary alloy (e.g., an alloy containing four metallic elements), a quinary alloy (e.g., an alloy containing five metallic elements), a senary alloy (e.g., an alloy containing six metallic elements), and/or a high order alloy (e.g., an alloy containing more than six metallic elements). In some embodiments, the second electrode 440 may include one or more alloys containing a first metallic element and one or more second metallic elements. Each of the second metallic elements may be less or more reactive to the transition metal oxide in the switching oxide layer than the first metallic element. In some embodiments, the first metallic element may be Ta. The second metallic elements may include one or more of W, Hf, Mo, Nb, Zr, etc. In some embodiments, the ratio of the first metallic element to the second metallic element(s) in an alloy in the second electrode 340 may be about 50 atomic percent. In some embodiments, the suitable ratio of the first metallic element to the second metallic element in the alloy may be optimized from the entire composition range. During a forming process, the second metallic element(s) may create fewer oxygen vacancies in the switching oxide layer than the first metallic element. As such, the lateral size of the filament formed in an RRAM device comprising a second electrode containing the alloy may be smaller than that of the filament formed in an RRAM device comprising a second electrode made of only the first metal. The implementation of alloy in the second electrode 440 in the RRAM device may result in a less abrupt forming process, reduce the forming voltage, reduce the reset current, and reduce voltage and/or current requirements in subsequent operation processes.

As an example, the second electrode 440 may include one or more alloys containing Ta (also referred to as "Ta alloys"). Each of the Ta alloys may include Ta and one or more other metallic elements (e.g., Hf, W, Mo, Nb, Zr, etc.). As an example, the second electrode 440 may include one or more binary alloys containing Ta. Examples of the binary alloys containing Ta include a Ta—Hf alloy, a Ta—W alloy, a Ta—Mo alloy, a Ta—Nb alloy, a Ta—Zr alloy, etc. As another example, the second electrode 440 may include one or more ternary alloys containing Ta. Examples of the ternary alloys containing Ta include a Ta—Hf—Mo alloy, a Ta—Hf—Nb alloy, a Ta—Hf—W alloy, a Ta—Hf—Zr alloy, a Ta—Mo—Nb alloy, a Ta—Mo—W alloy, a Ta—Mo—Zr alloy, a Ta—Nb—W alloy, a Ta—Nb—Zr alloy, a Ta—W—Zr alloy, etc. As still another example, the second electrode 440 may include one or more quaternary alloys containing Ta. Examples of the quaternary alloys containing Ta include a Ta—Hf—Mo—Nb alloy, a Ta—Hf—Mo—W alloy, a Ta—Hf—Mo—Zr alloy, a Ta—Hf—Nb—W alloy, a Ta—Hf—Nb—Zr alloy, a Ta—Mo—Nb—W alloy, a Ta—Mo—Nb—Zr alloy, a Ta—Nb—W—Zr alloy, etc. As a further example, the second electrode 440 may include one or more quinary alloys containing Ta. Examples of the quinary alloys containing Ta include a Ta—Hf—Mo—Nb—W alloy, a Ta—Mo—Nb—W—Zr alloy, a Ta—Hf—Nb—W—Zr alloy, a Ta—Hf—Mo—W—Zr alloy, a Ta—Hf—Mo—Nb—Zr alloy, etc. As still a further example, the second electrode 440 may include a senary alloy containing Ta, such as a Ta—Hf—Mo—Nb—W—Zr alloy. As a further example, the second electrode 440 may include a high order alloy containing Ta. In some embodiments, the high order alloy may further contain vanadium (V).

In some embodiments, the second electrode 440 may include a plurality of alloys. Each of the alloys may be a Ta alloy containing Ta and one or more other metallic elements (e.g., Hf, W, Mo, Nb, Zr, etc.). The Ta alloy may be and/or include a binary alloy, a ternary alloy, a quaternary alloy, a quinary alloy, a senary alloy, a high-order alloy, etc. As an example, the second electrode 440 may include two or more of a first alloy containing Ta, a second alloy containing Ta, a third alloy containing Ta, a fourth alloy containing Ta, a fifth alloy containing Ta, and a sixth alloy containing Ta. In some embodiments, the first alloy containing Ta, the second alloy containing Ta, the third alloy containing Ta, the fourth alloy containing Ta, the fifth alloy containing Ta, and the sixth alloy containing Ta may be a binary alloy, a ternary alloy, a quaternary alloy, a quinary alloy, a senary alloy, and a high-order alloy, respectively.

In some embodiments, multiple alloys in the second electrode 440 may correspond to combinations of the same number of metallic elements. For example, the first alloy containing Ta and the second alloy containing Ta may include a first binary alloy containing Ta (e.g., a Ta—W alloy) and a second binary alloy containing Ta (e.g., a Ta—Mo alloy), respectively. As another example, the first alloy containing Ta and the second alloy containing Ta may include a first ternary alloy containing Ta (e.g., a Ta—Hf—Mo alloy) and a second ternary alloy containing Ta (e.g., a Ta—Hf—Nb alloy), respectively. As a further example, the second electrode 440 may include a plurality of alloy systems. Each of the alloy systems may contain the alloys containing the mixtures of certain metallic elements with varying compositions. For example, a binary system may include one or more binary alloys of two metallic elements (e.g., Ta and Hf) with varying compositions. Each of the binary alloys may be a combination of the two metallic elements with a certain composition. As another example, a ternary system may include one or more ternary alloys of three metallic elements (e.g., Ta, Hf, and W) with varying compositions. Each of the ternary alloys may be a combination of the three metallic elements with a certain composition. In some embodiments, the second electrode 440 may include a Ta alloy system containing one or more alloy systems. In some embodiments, the Ta alloy system may include two or more alloy systems. For example, the Ta alloy system may contain a senary system containing one or more alloys of Ta, Hf, W, Mo, Nb, and Zr. The Ta alloy system may further include one or more binary systems, ternary systems, quaternary systems, and/or quinary systems containing Ta alloys. The binary systems may include one or more of a Ta—Hf alloy system, a Ta—W alloy system, a Ta—Mo alloy system, a Ta—Nb alloy system, and/or a Ta—Zr alloy system. The ternary systems may include one or more of a Ta—Hf—Mo alloy system, a Ta—Hf—Nb alloy system, a Ta—Hf—W alloy system, a Ta—Hf—Zr alloy system, a Ta—Mo—Nb alloy system, a Ta—Mo—W alloy system, a Ta—Mo—Zr alloy system, a Ta—Nb—W alloy system, a Ta—Nb—Zr alloy system, and/or a Ta—W—Zr alloy system. The quaternary systems may include one or more of a Ta—Hf—Mo—Nb alloy system, a Ta—Hf—Mo—W alloy system, a Ta—Hf—Mo—Zr alloy system, a Ta—Hf—Nb—W alloy system, a Ta—Hf—Nb—Zr alloy system, a Ta—Mo—Nb—W alloy system, a Ta—Mo—Nb—Zr alloy system, a Ta—Nb—W—Zr alloy system. The quinary systems may include one or more of a Ta—Hf—Mo—Nb—W alloy system, a Ta—Mo—Nb—W—Zr alloy system, a Ta—Hf—Nb—W—Zr alloy system, a Ta—Hf—Mo—W—Zr alloy system, and/or a Ta—Hf—Mo—Nb—Zr alloy system. Each of the alloy systems contained in the second electrode 440 may have unique thermodynamic and kinetic characteristics and may be regarded as an electrode component. As such, the second electrode 440 may include multiple electrode components for providing multiple state variables that may lead to rich dynamics with various time constants for computing and learning. For example, each electrode component may have different reactivity to the switching oxide or the affinity for oxygen. Each electrode element may have different diffusivity (e.g., self-diffusion, inter-diffusion, diffusion time constants, etc.). The second electrode 440 with multiple components may provide the multiple dynamic behavior for IMC applications. As such, the RRAM device incorporating the multi-component second electrode may present dynamic memristive behavior in multiple dimensions.

Figure 4E:
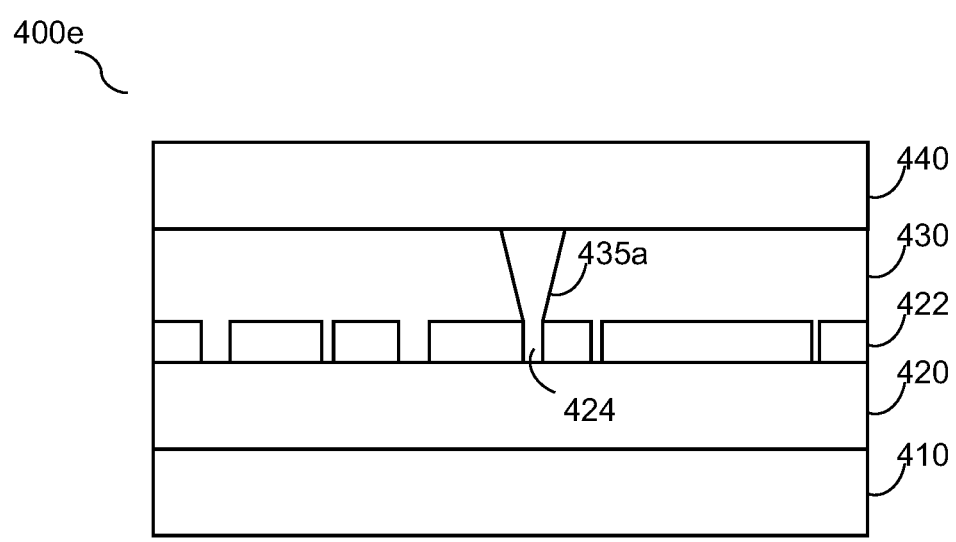
Figure 4F:
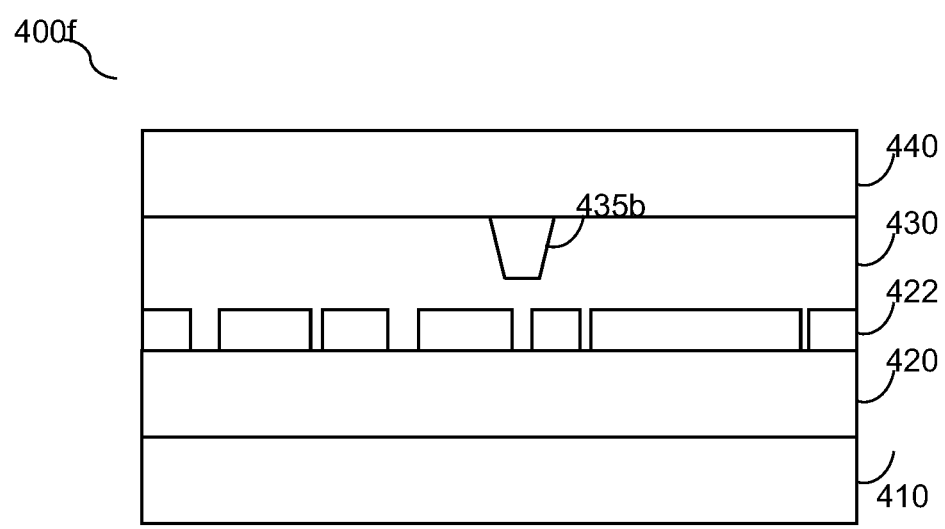

FIGS. 4E and 4F illustrate semiconductor devices 400e and 400f that may correspond to a low-resistance state and a high-resistance state of the RRAM device 400d, respectively. The incorporation of the discontinuous film 422 may reduce the contact area between the switching oxide layer 430 and the first electrode 420. As illustrated in FIG. 4E, a conductive channel 435a (e.g., a filament) may be formed from the second electrode 440 to the first electrode 420 through the interface layer 422 and the switching oxide layer 430. As illustrated in FIG. 4F, an interrupted conductive channel 435b may be formed in the switching oxide layer 430 during the reset process. Compared with FIGS. 3B and 3C, the lateral size of the conductive channel 435a and the interrupted conductive channel 435b may be smaller than that of 335a and 335b, respectively. As such, the lateral size of the filament formed in an RRAM device with discontinuous film 422 may be smaller than that of the filament formed in an RRAM device without a porous or discontinuous film formed between the first electrode and the switching oxide layer. The incorporation of the discontinuous film 422 into the RRAM device may result in a less abrupt forming process, reduce the forming voltage, reduce the reset current, and reduce voltage and/or current requirements in subsequent operation processes.

Figure 5A:
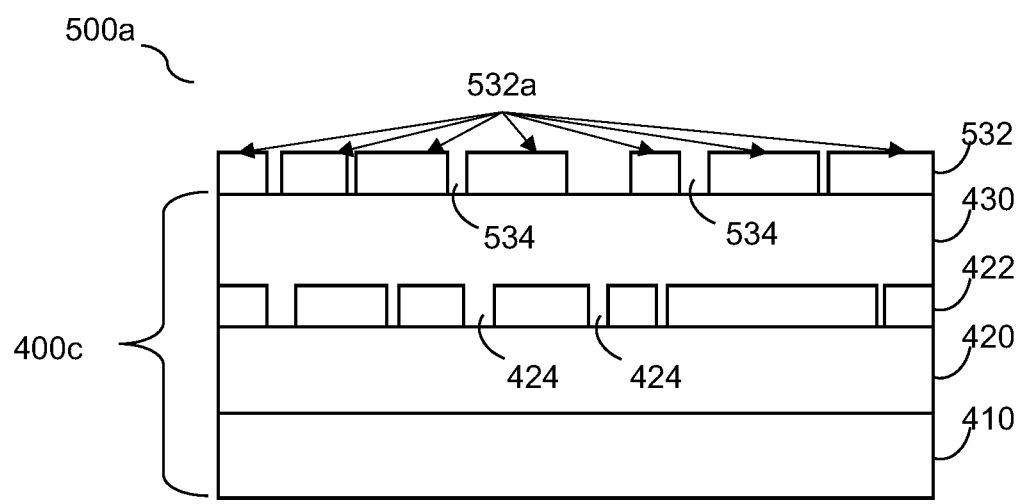

In some embodiments, an RRAM device may include multiple interface layers fabricated between the first electrode and the second electrode. Each of the interface layers may include a discontinuous film as described in connection with FIG. 4B. For example, as illustrated in FIG. 5A, a semiconductor device 500a may be fabricated, by fabricating an interface layer 532 (also referred to as the "second interface layer") on the semiconductor structure 400c as described in connection with FIG. 4C. In some embodiments, the second interface layer 532 may include a discontinuous film 532a of a second material. The second material may be more chemically stable than the at least one transition metal oxide in the switching oxide layer 430. As an example, the second material may include $Al_2O_3$, $MgO$, $Y_2O_3$, $La_2O_3$, etc. The second material may or may be the same as the first material.

The discontinuous film 532a may include one or more pores 534 (also referred to as the "one or more second pores"). The pore(s) 534 may have any suitable size and/or dimension. Multiple pores 534 may or may not have the same size and/or dimension. In some embodiments, the second interface layer 532 and/or the second discontinuous film 532a may include multiple pores 534 dispersed randomly on the second discontinuous film 532. The discontinuous film 532a may include any suitable number of pores.

In some embodiments, a thickness of the second interface layer 532 and/or the second discontinuous film (also referred to as the "second thickness") may be between about 0.2 nm and about 0.5 nm. As another example, the second interface layer 532 may include a discontinuous $Al_2O_3$ film having a thickness equal to or less than 0.5 nm. In some embodiments, the second interface layer 532 may include a discontinuous $Al_2O_3$ film having a thickness less than 1 nm. The second thickness of the second interface layer 532 may or may not be the same as the first thickness of the first interface layer 422.

Figure 5B:
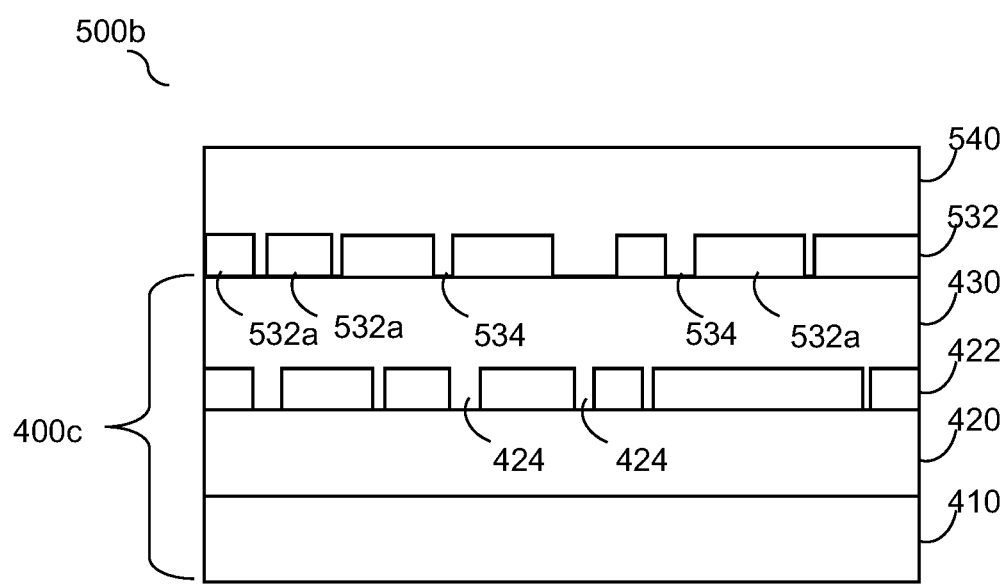

As illustrated in FIG. 5B, a second electrode 540 may be fabricated on the second interface layer 532 to fabricate a semiconductor device 500b. The second interface layer 532 may thus be positioned between the switching oxide layer 430 and the second electrode 540. The second electrode 540 may be and/or include the second electrode 440 as described in conjunction with FIGS. 4D-4F. In some embodiments, during the fabrication of the switching oxide layer 430, one or more portions of the second electrode 540 may be disposed on the switching oxide layer 430 through one or more pores 534. As such, the second electrode 540 may contact one or more portions of the switching oxide layer 430 through the one or more pores 534.

Figure 5C:
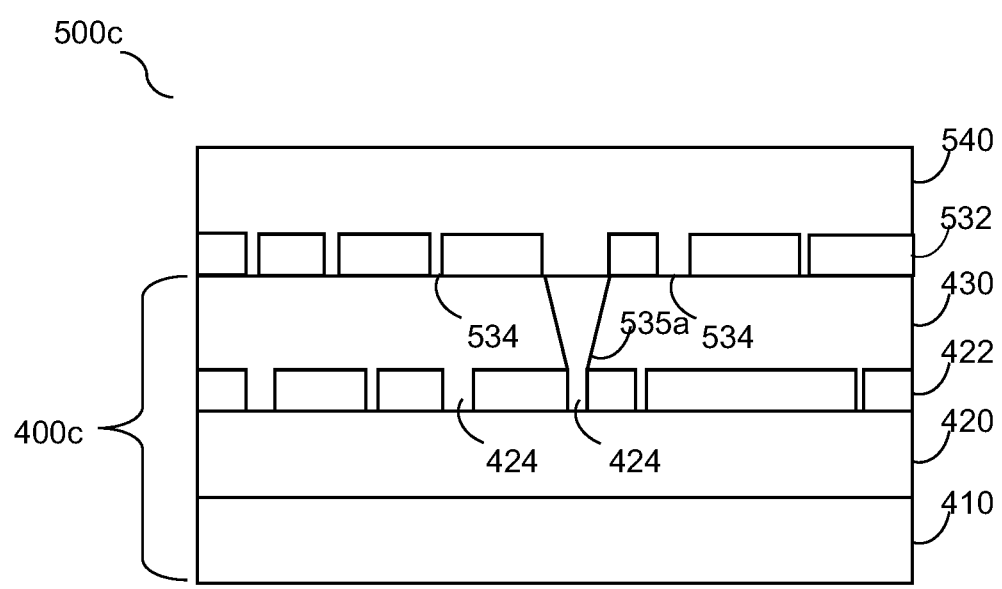
Figure 5D:
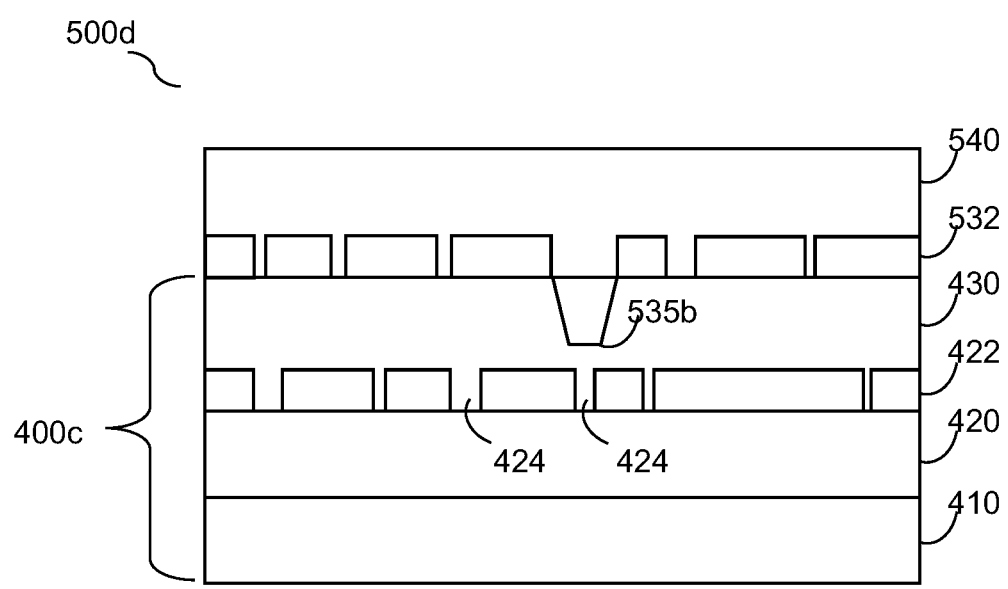

FIGS. 5C and 5D illustrate semiconductor devices 500c and 500d that may correspond to a low-resistance state and a high-resistance state of the RRAM device 500b, respectively. The incorporation of both the first interface layer 422 and the second interface layer 532 may further reduce the contact area between the switching oxide layer 430 and the first electrode 420 and the contact area between the switching oxide layer 430 and the second electrode 540. As illustrated in FIG. 5C, a conductive channel 535a (e.g., a filament) may be formed from the first electrode 420 to the second electrode 540 through the interface layer 422, the switching oxide layer 430, and the second discontinuous film 532. As illustrated in FIG. 5D, an interrupted conductive channel 535b may be formed in the switching oxide layer 530 during the reset process. Compared with FIGS. 3B and 3C, the lateral size of the conductive channel 535a and the interrupted conductive channel 535b may be further smaller than that of 335a and 335b, respectively. As such, the lateral size of the filament formed in an RRAM device with both the interface layer 422 and the second interface layer 532 may be further reduced, resulting in a less abrupt forming process, reducing the forming voltage, reducing the reset current, and reducing voltage and/or current requirements in subsequent operation processes.

Figure 6A:
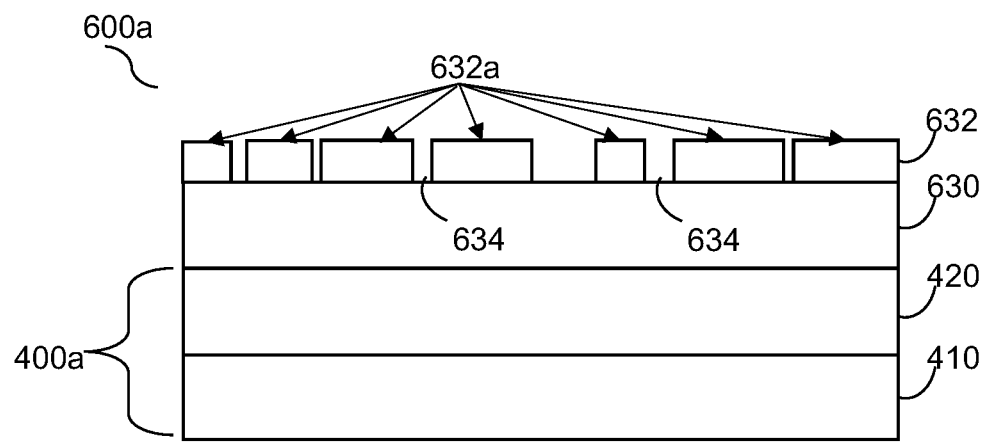

In some embodiments, an interface layer may be fabricated on a switching oxide layer of an RRAM device in accordance with some embodiments of the present disclosure. For example, as illustrated in FIG. 6A, a switching oxide layer 630 may be fabricated on the semiconductor device 400a as described in FIG. 4A. An interface layer 632 may be fabricated on the switching oxide layer 630 to fabricate a semiconductor device 600a. The switching oxide layer 630 may be and/or include the switching oxide layer 430 as described in conjunction with FIGS. 4C-4F. In some embodiments, the interface layer 632 may include a discontinuous film of a third material. The third material may be more chemically stable than the at least one transition metal oxide in the switching oxide layer 630. As an example, the third material may include $Al_2O_3$, $MgO$, $Y_2O_3$, $La_2O_3$, etc.

The discontinuous film 632a may include one or more pores 634 (also referred to herein as the "one or more third pores"). The pore(s) 634 may have any suitable size and/or dimension and may be dispersed randomly on the interface layer 632. In some embodiments, a thickness of the interface layer 632 (also referred to as the "third thickness") may be between about 0.2 nm and about 0.5 nm. As another, the interface layer 632 may have a thickness equal to or less than 0.5 nm thickness. As a further example, the interface layer 632 may have a thickness less than 1 nm.

Figure 6B:
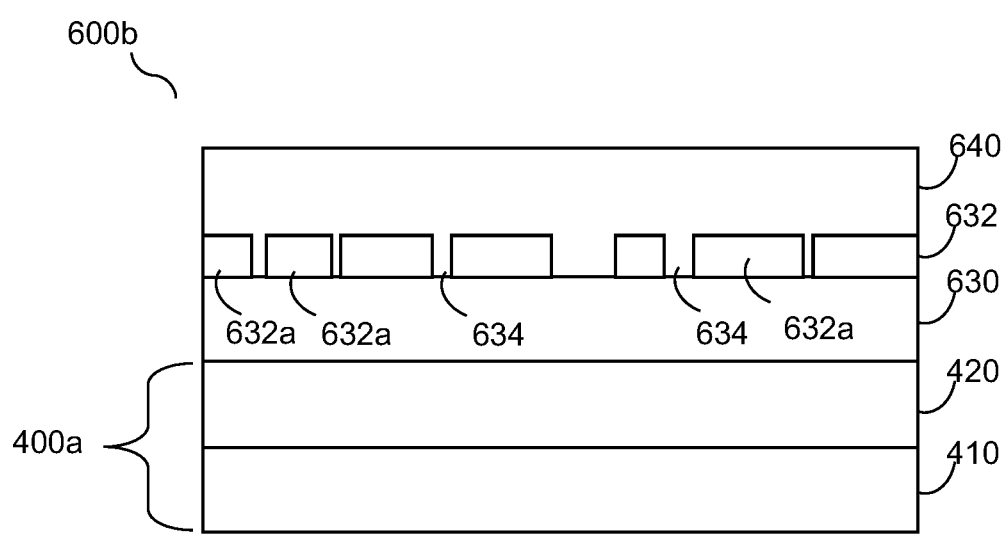

As illustrated in FIG. 6B, a second electrode 640 may be fabricated on the interface layer 632 to fabricate a semiconductor device 600b. The interface layer 632 may thus be positioned between the switching oxide layer 630 and the second electrode 640. The second electrode 640 may be and/or include the second electrode 440 as described in conjunction with FIGS. 4D-4F. In some embodiments, during the fabrication of the second electrode 640, one or more portions of the second electrode 640 may be disposed on the switching oxide layer 630 through one or more pores 634. As such, the second electrode 640 may contact one or more portions of the switching oxide layer 630.

Figure 6C:
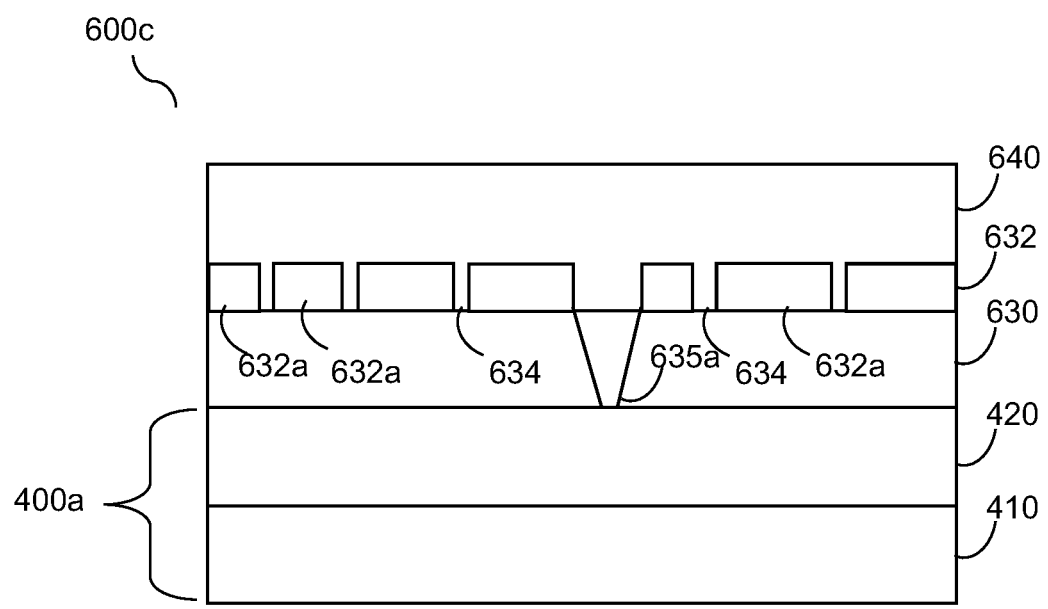
Figure 6D:
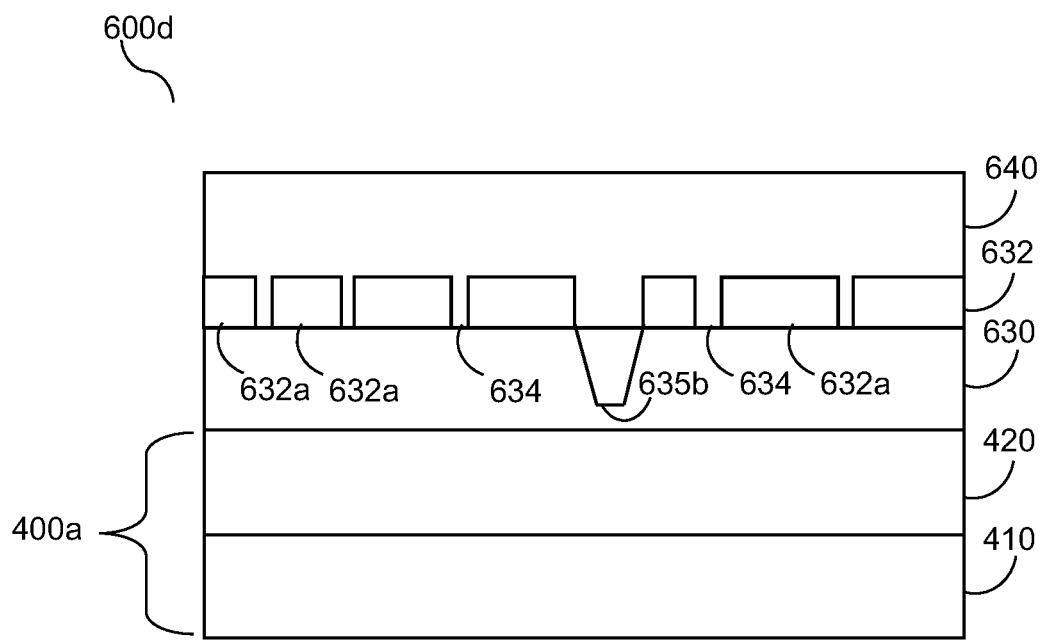

FIGS. 6C and 6D illustrate semiconductor devices 600c and 600d that may correspond to a low-resistance state and a high-resistance state of the RRAM device 600b, respectively. The incorporation of the discontinuous film 632 may reduce the contact area between the switching oxide layer 630 and the second electrode 640. As illustrated in FIG. 6C, a conductive channel 635a (e.g., a filament) may be formed from the second electrode 640 to the first electrode 420 through the switching oxide layer 630 and the discontinuous film 632. As illustrated in FIG. 6D, an interrupted conductive channel 635b may be formed in the switching oxide layer 630 during the reset process. Compared with FIGS. 3B and 3C, the lateral size of the conductive channel 635a and the interrupted conductive channel 635b may be smaller than that of 335a and 335b, respectively. As such, the lateral size of the filament formed in an RRAM device with a discontinuous film 632 may be smaller than that of the filament formed in an RRAM device without the discontinuous film 632. The incorporation of a discontinuous film 632 into the RRAM device may result in a less abrupt forming process, reduce the forming voltage, reduce the reset current, and reduce voltage and/or current requirements in subsequent operation processes.

Figure 7:
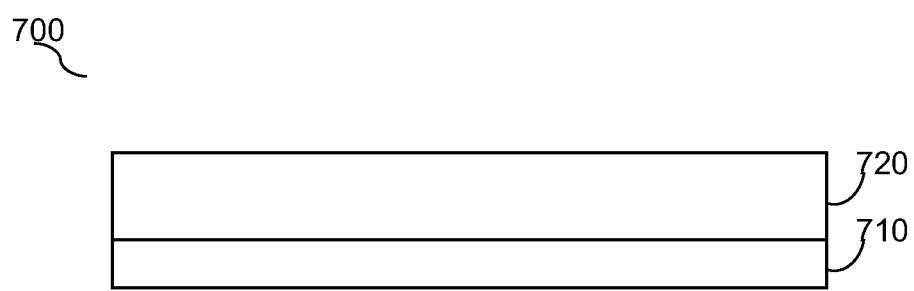
FIG. 7 is a schematic diagram illustrating cross-sectional views of a top electrode of an RRAM device in accordance with some embodiments of the present disclosure.

FIG. 7 is a schematic diagram illustrating cross-sectional views of an example 700 of a top electrode in accordance with some embodiments of the present disclosure.

As shown, the top electrode 700 may include a first layer 710 and a second layer 720. The first layer 710 may include a first metallic material that may scavenge oxygen from the transition metal oxide(s) of the switching oxide layer. The second layer 720 may include a second metallic material that may scavenge oxygen from the transition metal oxide(s) of the switching oxide layer. The oxide of the first metallic material may have greater chemical stability than the transition metal oxide(s) of the switching oxide layer. As a result, the first metallic material may react with and scavenge oxygen from the transition metal oxide(s) of the switching oxide layer. The oxide of the first metallic material may have less chemical stability than the first material of the first discontinuous film and the second material of the second discontinuous film. As a result, the first metallic material may not chemically reduce the first discontinuous film and the second discontinuous film. As described above, the Ellingham diagrams may be employed to determine the comparative chemical stability of two or more elements.

Figure 9:
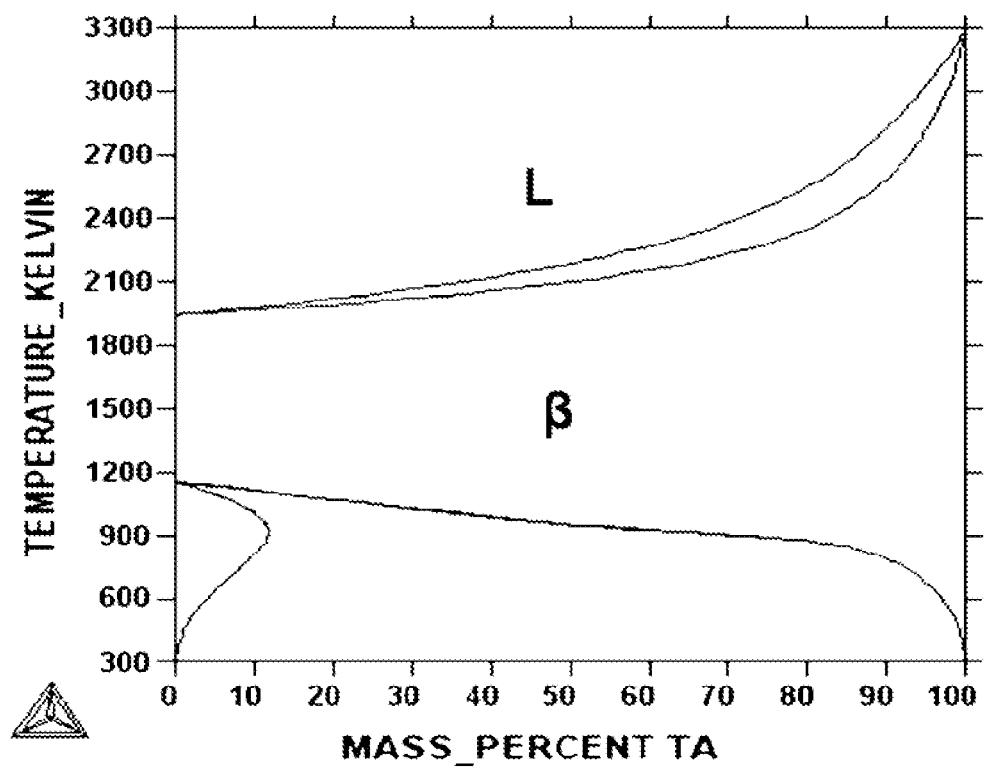
FIG. 9 depicts a tantalum-titanium (Ta—Ti) binary phase diagram in accordance with some embodiments of the present disclosure.

The first metallic material and the second metallic material may include different chemical elements and may have different affinities for oxygen and/or different thermodynamic and kinetic properties. The first metallic material and the second metallic material may be immiscible. In some embodiments, the first metallic material may include Ti. The second metallic material may include Ta. In some embodiments, the first layer 710 may be and/or include a layer of Ti metal (e.g., a Ti film). The second layer 720 may be and/or include a layer of Ta metal (e.g., a Ta film). As shown in the Ta—Ti binary phase diagram of FIG. 9, Ta and Ti phases are immiscible and have minimum mutual solubilities at 300K (27° C.) which is operating temperatures of RRAM devices (e.g., temperatures around or above room temperature). As such, the addition of Ti into the RRAM device may not affect the operation mechanism of the Ta filament in the switching oxide and the switching mechanism of RRAM devices as described herein. The RRAM devices as described in FIG. 7 may thus be used for IMC applications that require RRAM devices with excellent performance in analog behaviors, linearity, retention, reliability, etc. The immiscibility and minimum mutual solubilities between Ta and Ti phases may also enable a thermodynamic equilibrium between the second layer 720 and the first layer 710. As a result, a thin Ti film can function as designed without reacting with the Ta film or being dissolved by the Ta film.

Furthermore, Ti may readily scavenge oxygen from the switching oxide because it has higher affinity for oxygen than Ta. As such, the incorporation of the first layer 710 into the RRAM device may further improve the performance of the RRAM device by reducing the forming voltage required in the RRAM forming process and the current and voltage requirements in subsequent operations. For example, the second electrode 440 in FIGS. 4D-4F, the second electrode 540 in FIGS. 5B-5D, and/or the second electrode 640 in FIGS. 6B-6D as described above may be and/or include the second electrode 700. During a forming process, both the first metallic material and the second metallic material may generate oxygen vacancies in the switching oxide layer 330, 430, and/or 630. Compared with FIGS. 3B and 3C, the lateral size of the conductive channel and the interrupted conductive channel may be smaller than that of 335a and 335b, respectively. As Ti has a higher affinity for oxygen than Ta, the virgin resistance of an RRAM device including the top electrode 700 may be lower than that of an RRAM device that does not include the top electrode 700, resulting in the lower forming voltage, the lower reset voltage, the low reset current, etc.

Ti may also readily store oxygen during a set process (when oxygen is migrating from switching oxide to the second electrode). This may enable the second electrode to store oxygen during the reset process and may thus prevent device failures (which can be caused by the presence of oxygen molecules between switching oxide and the second electrode) and/or operation failures (which can be caused by the oxygen migrating back to the switching oxide once the reset voltage being removed, or the switch being volatile).

The first layer 710 may be grown to a suitable thickness so that the first metallic material (e.g., Ti) of the first layer 710 may function as described above without affecting the formation of the filament comprising the second metallic material (e.g., a Ta filament) in the switching oxide layer 330. In some embodiments, a thickness of the first layer 710 may be between about 0.2 nm and about 5 nm. In some embodiments, a thickness of the first layer 710 may be between about 0.5 nm and about 2 nm. In some embodiments, a thickness of the first layer 710 may be about 1 nm. In some embodiments, a thickness of the first layer 710 may be less than 1 nm. The second layer 720 may be thicker than the first layer 710. In some embodiments, a thickness of the second layer 720 may be between 5 nm and 300 nm. For example, the thickness of the second layer 720 may be between about 10 nm and about 100 nm. In some embodiments, the thickness of the second layer 720 may be between about 10 nm and about 200 nm. In some embodiments, the thickness of the second layer 720 may be about 50 nm. A thickness of the first electrode may be between about 5 nm and 100 nm. In some embodiments, the thickness of the first electrode may be about 30 nm. In some embodiments, a dimension (e.g., a critical dimension) of RRAM device 400d, 500b, and/or 600b may be between 1 μm and single digit nanometers. In some embodiments, the critical dimension of RRAM device 400d, 500b, and/or 600b may be about or less than 0.28 μm, and/or between 1 μm and 1 nanometer. In some embodiments, the critical dimension of RRAM device 400d, 500b, and/or 600b may be between 1 μm and 2 nm. In some embodiments, the critical dimension of RRAM device 400d, 500b, and/or 600b may be between 1 μm and 5 nm. In some embodiments, the critical dimension of RRAM device 400d, 500b, and/or 600b may be at the single-digit nanoscale (e.g., between about 1 nm and about 9 nm).

In one implementation, the second layer 720 may be fabricated directly on the first layer 710. For example, as shown in FIG. 7, a surface of the second layer 720 may directly contact one or more portions of a surface of the first layer 710. In another implementation, one or more other layers of suitable materials may be deposited between the first layer 710 and the second layer 720.

The incorporation of the first layer 710 in RRAM device may reduce the virgin resistance of the RRAM device, reduce the forming voltage, and reduce the reset current, resulting in a less abrupt forming process, a filament with lower conductance, and lower voltage and current in the subsequent operation process.

While certain components of RRAM devices 400*d-f*, 500*b-d*, and 600*b-d* are shown in FIGS. 4D-4F, 5B-5D, and 6B-6D, this is merely illustrative. RRAM devices 400*d-f*, 500*b-d*, and 600*b-d* may include one or more other layers of suitable materials for implementing IMC applications. For example, one or more interfacial layers (not shown) may be fabricated between the switching oxide layer and one or more of the second electrode and the first electrode to improve the interface stability and device performance.

Figure 10:
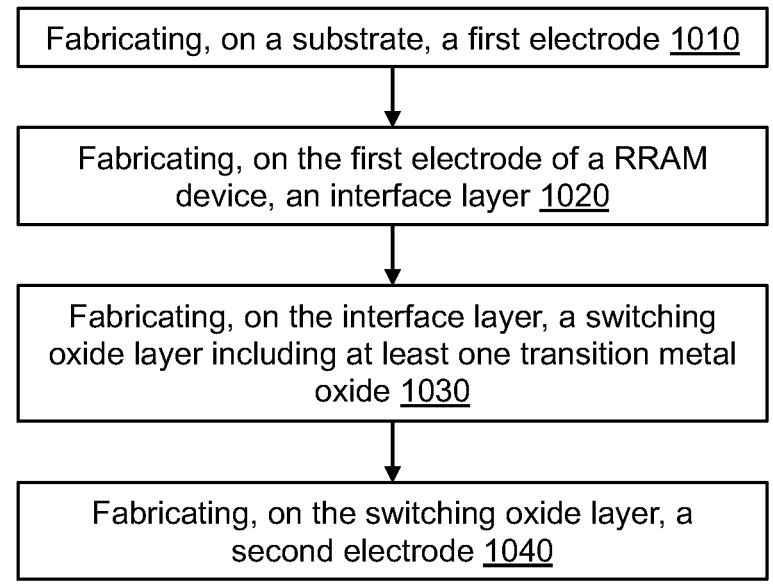
FIG. 10 is a flow diagram illustrating a method for fabricating an RRAM device in accordance with some embodiments of the present disclosure.

FIG. 10 is a flow diagram illustrating an example 1000 of a method for fabricating an RRAM device according to some embodiments of the disclosure.

At block 1010, a first electrode may be fabricated on a substrate. Fabricating the first electrode may involve depositing one or more layers of one or more nonactive metals, such as Pt, Pd, Ir, etc. utilizing a physical vapor deposition (PVD) technique, a chemical vapor deposition (CVD) technique, a sputtering deposition technique, an atomic layer deposition (ALD) technique, and/or any other suitable deposition technique. In some embodiments, fabricating the first electrode may involve depositing one or more layers of Pt. The first electrode may be and/or include first electrode 320, 420 as described in connection with FIGS. 3A-6D above.

At block 1020, an interface layer may be fabricated on the first electrode. Fabricating the interface layer may involve depositing a first material on the first electrode to form a first discontinuous film of the first material. The first discontinuous film may contain one or more first pores. The first material may be more chemically stable than the transition metal oxide(s) in the switching oxide layer as described below. In some embodiments, the first material may include $Al_2O_3$, MgO, $Y_2O_3$, $La_2O_3$, etc. The interface layer may be and/or include the first interface layer 422 as described in connection with FIGS. 4B-5D above in some embodiments. In some embodiments, fabricating the interface layer may involve depositing a layer of the first material having a suitable thickness to form the first discontinuous film. For example, fabricating the first interface layer may involve depositing the first material to a thickness between about 0.2 nm and about 1 nm. The first discontinuous film may be deposited utilizing PVD, CVD, ALD, and/or any other suitable deposition technique.

At block 1030, a switching oxide layer may be fabricated on the interface layer. The switching oxide layer may include one or more transition metal oxides. The transition metal oxides may include, for example, $TaO_x$, $HfO_x$, $TiO_x$, $NbO_x$, $ZrO_x$, etc. In some embodiments, during the fabrication of the switching oxide layer, one or more portions of the transition metal oxides may be disposed on the first electrode through one or more of the first pores. The switching oxide layer may be deposited utilizing PVD, CVD, ALD, and/or any other suitable deposition technique. The switching oxide layer may be and/or include switching oxide layer 430 as described in connection with FIGS. 4C-5D above.

At block 1040, a second electrode may be fabricated on the switching oxide layer. The second electrode may include one or more alloys. Each of the alloys may contain a first metallic element and one or more second metallic elements. Each of the second metallic elements and the first metallic element may have different reactivity to the transition metal oxide in the switching oxide layer. In some embodiments, the first metallic element may be Ta. The second metallic elements may be one or more of W, Hf, Mo, Nb, Zr, etc. Based on the binary phase diagrams involving Ta and the second metallic elements W, Hf, Mo, Nb, or Zr as shown in FIGS. 14A-14E, Ta—W (FIG. 14B), Ta—Mo (FIG. 14C), and Ta—Nb (FIG. 14D) form continuous solid solution, and Ta—Hf (FIG. 14A) and Ta—Zr (FIG. 14E) are immiscible at RRAM devices operation temperatures. No binary intermetallic compounds may form in all these binaries. No intermetallic compounds in these binary systems are advantageous for IMC applications involving an alloy electrode which may be readily fabricated and controlled. For example, fabricating the second electrode may involve fabricating the alloy by co-sputtering the first metal and the second metal. As another example, fabricating the second electrode may involve sputtering from an alloy target (e.g., a Ta—W alloy, Ta—Hf alloy, Ta—Mo alloy, Ta—Nb alloy, Ta—Zr alloy, etc.) for a required composition between the first metallic element (e.g., a pure Ta metal) and the second metallic element(s) (e.g., a pure Hf metal).

In some embodiments, fabricating the second electrode may involve fabricating multiple electrode components including Ta, Hf, Nb, Mo, W, and/or Zr. Each of the electrode components may be and/or include a binary alloy, a ternary alloy, a quaternary alloy, a quinary alloy, a senary alloy, and/or a high order alloy of Ta. For example, fabricating the second electrode may involve fabricating the second electrode 340*b* with one or more alloys and/or alloy systems as described in connection with FIG. 4D. More particularly, for example, fabricating the second electrode may involve fabricating two or more of a first alloy containing Ta, a second alloy containing Ta, a third alloy containing Ta, a fourth alloy containing Ta, a fifth alloy containing Ta, and a sixth alloy containing Ta. The first alloy containing Ta, the second alloy containing Ta, the third alloy containing Ta, the fourth alloy containing Ta, the fifth alloy containing Ta, and the sixth alloy containing Ta may be a binary alloy, a ternary alloy, a quaternary alloy, a quinary alloy, a senary alloy, and a high-order alloy, respectively.

In some embodiments, fabricating the second electrode may involve fabricating multiple layers of multiple metallic materials, such as layers 710 and 720 as described in conjunction with FIG. 7. In some embodiments, the second electrode may be fabricated by performing one or more operations as described in connection with FIG. 13.

The second electrode may be deposited utilizing PVD, CVD, ALD, and/or any other suitable deposition technique. The second electrode may be and/or include second electrode 440 as described in connection with FIGS. 4D-4F above.

Figure 11:
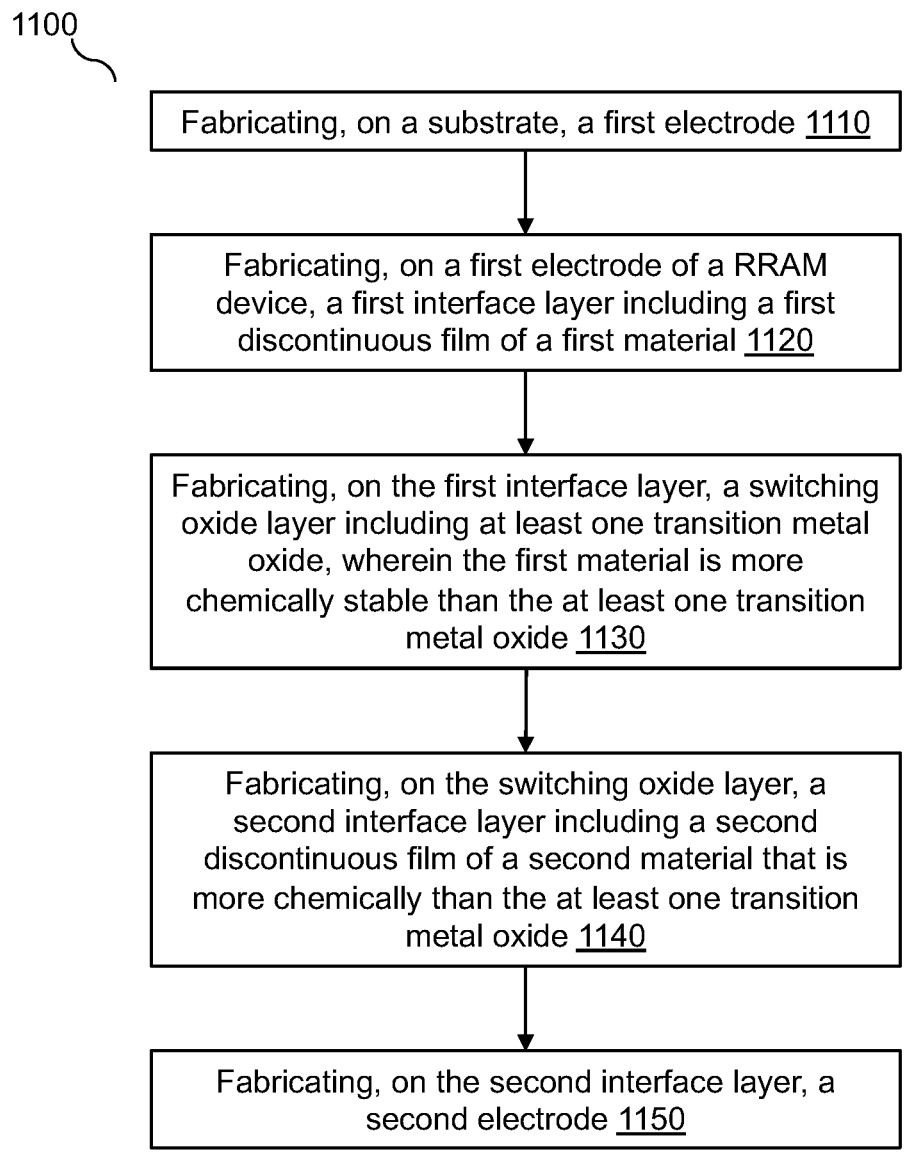
FIG. 11 is a flow diagram illustrating a method for fabricating an RRAM device in accordance with some embodiments of the present disclosure.

FIG. 11 is a flow diagram illustrating an example 1100 of a method for fabricating an RRAM device according to some embodiments of the disclosure.

At block 1110, a first electrode may be fabricated on a substrate. The first electrode may be fabricated on the substrate by performing one or more operations described in connection with block 1010 of FIG. 10. The first electrode may be and/or include first electrode 320 and/or 420 as described in connection with FIGS. 3A-6D above.

At block 1120, a first interface layer may be fabricated on the first electrode. Fabricating the first interface layer may involve fabricating a first discontinuous film of a first material. The first interface layer may be fabricated on the first electrode by performing one or more operation described in connection with block 1020 of FIG. 10. The first interface layer may be and/or include the first interface layer 422 as described in connection with FIGS. 4B-5D above.

At block 1130, a switching oxide layer may be fabricated on the first interface layer. The switching oxide layer may be fabricated on the first interface layer by performing one or more operation described in connection with block 1030 of FIG. 10. The switching oxide layer may be and/or include switching oxide layer 430 as described in connection with FIGS. 4C-5D above.

At block 1140, a second interface layer may be fabricated on the switching oxide layer. Fabricating the second interface layer may involve fabricating a second discontinuous film of a second material that is more chemically stable than the transition metal oxide(s) of the switching oxide layer. In some embodiments, the second material may include $Al_2O_3$, $MgO$, $Y_2O_3$, $La_2O_3$, etc. In some embodiments, fabricating the second interface layer may involve depositing the second material to a suitable thickness (e.g., a thickness between 0.2 nm and 1 nm) to form the second discontinuous film. The discontinuous film may be deposited utilizing PVD, CVD, ALD, and/or any other suitable deposition technique. The second interface layer may be and/or include second interface layer 532 as described in connection with FIGS. 5A-5D.

At block 1150, a second electrode may be fabricated on the second interface layer. The second electrode may be fabricated on the second interface layer by performing one or more operation described in connection with block 1040 of FIG. 10. In some embodiments, during the fabrication of the second electrode, one or more portions of the second electrode may be deposited on the switching oxide layer through the one or more second pores. The second electrode may be and/or include second electrode 540 as described in connection with FIGS. 5B-5D above.

Figure 12:
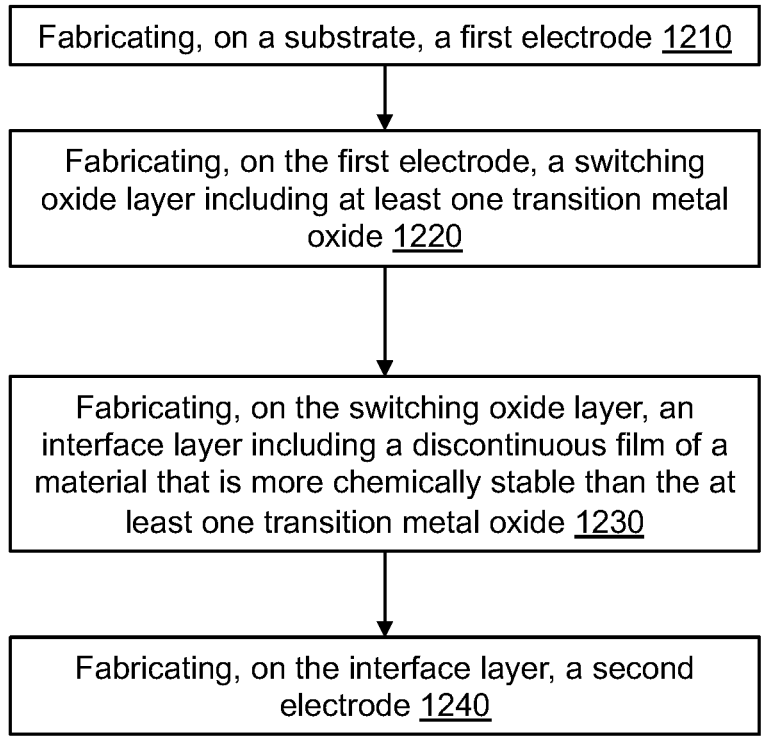
FIG. 12 is a flow diagram illustrating a method for fabricating an RRAM device in accordance with some embodiments of the present disclosure.

FIG. 12 is a flow diagram illustrating an example 1200 of a method for fabricating an RRAM device according to some embodiments of the disclosure.

At block 1210, a first electrode may be fabricated on a substrate. The first electrode may be fabricated on the substrate by performing one or more operations described in connection with block 1010 of FIG. 10. The first electrode may be and/or include first electrode 320 as described in connection with FIGS. 3A-6D above.

At block 1220, a switching oxide layer may be fabricated on the first electrode. The switching oxide layer may include one or more transition metal oxides. The transition metal oxides may include, for example, $TaO_x$, $HfO_x$, $TiO_x$, $NbO_x$, $ZrO_x$, etc. The switching oxide layer may be deposited utilizing PVD, CVD, ALD, and/or any other suitable deposition technique. The switching oxide layer may be and/or include switching oxide layer 630 as described in connection with FIGS. 6A-6D above.

At block 1230, an interface layer may be fabricated on the switching oxide layer. The interface layer may include a discontinuous film of a material that is more chemically stable than the transition metal oxide(s) in the switching oxide layer. The interface layer may be fabricated on the switching oxide layer by performing one or more operations described in connection with block 1140 of FIG. 11. The interface layer may be and/or include the second interface layer 632 as described in connection with FIGS. 6A-6D above.

At block 1240, a second electrode may be fabricated on the interface layer. The second electrode may be fabricated on the interface layer by performing one or more operations described in connection with block 1150 of FIG. 11. The second electrode may be and/or include the second electrode 640 as described in connection with FIGS. 6B-6D above.

Figure 13:
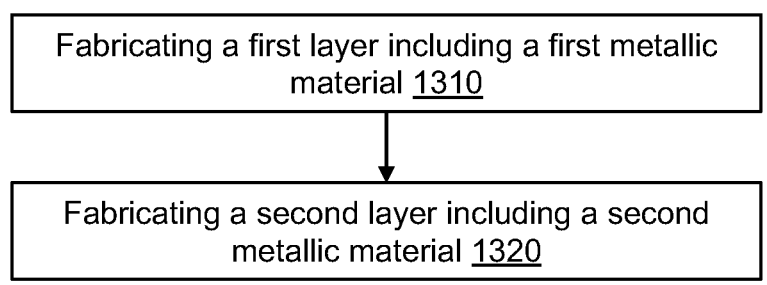
FIG. 13 is a flow diagram illustrating a method for fabricating a top electrode of an RRAM device in accordance with some embodiments of the present disclosure.
Figure 14A:
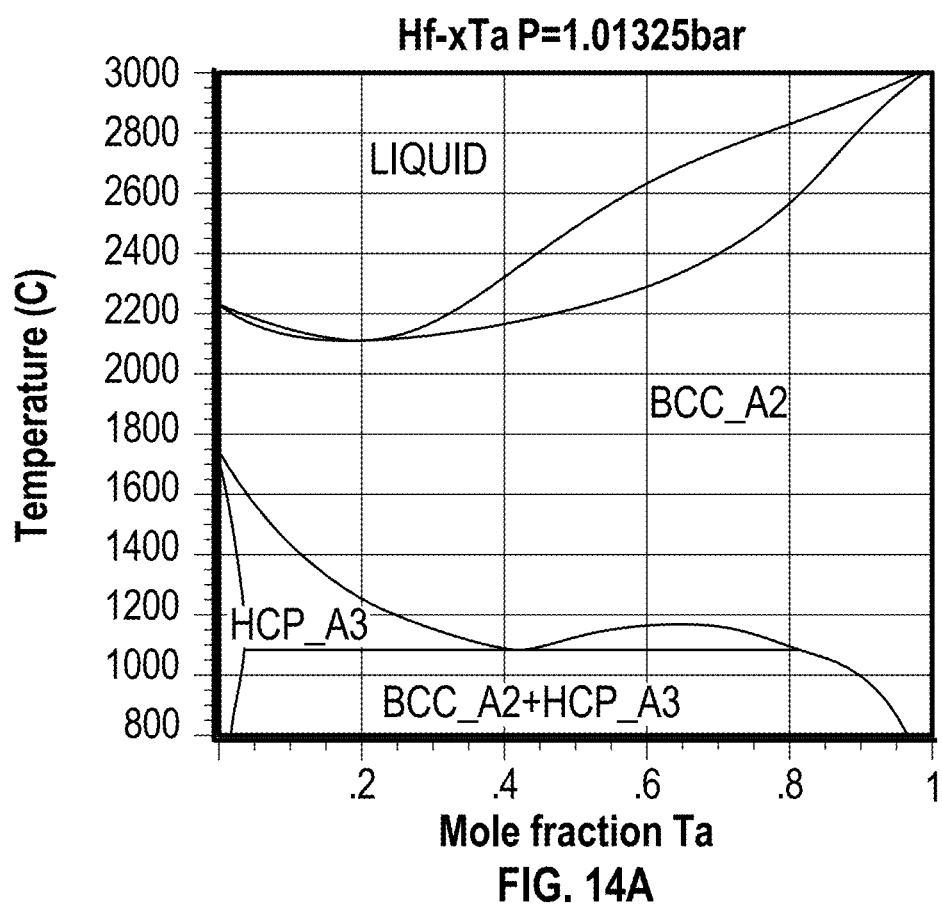
FIG. 14A depicts a tantalum-hafnium (Ta—Hf) binary phase diagram in accordance with some embodiments of the present disclosure.
Figure 14B:
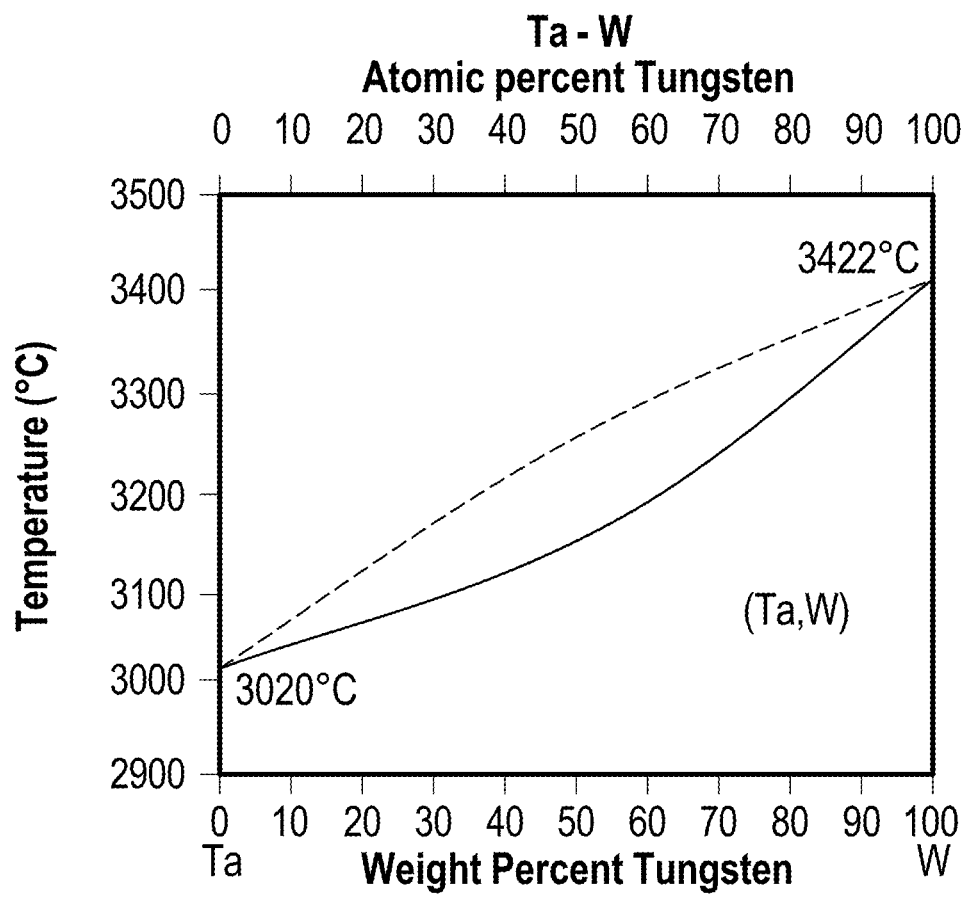
FIG. 14B depicts a tantalum-tungsten (Ta—W) binary phase diagram in accordance with some embodiments of the present disclosure.
Figure 14C:
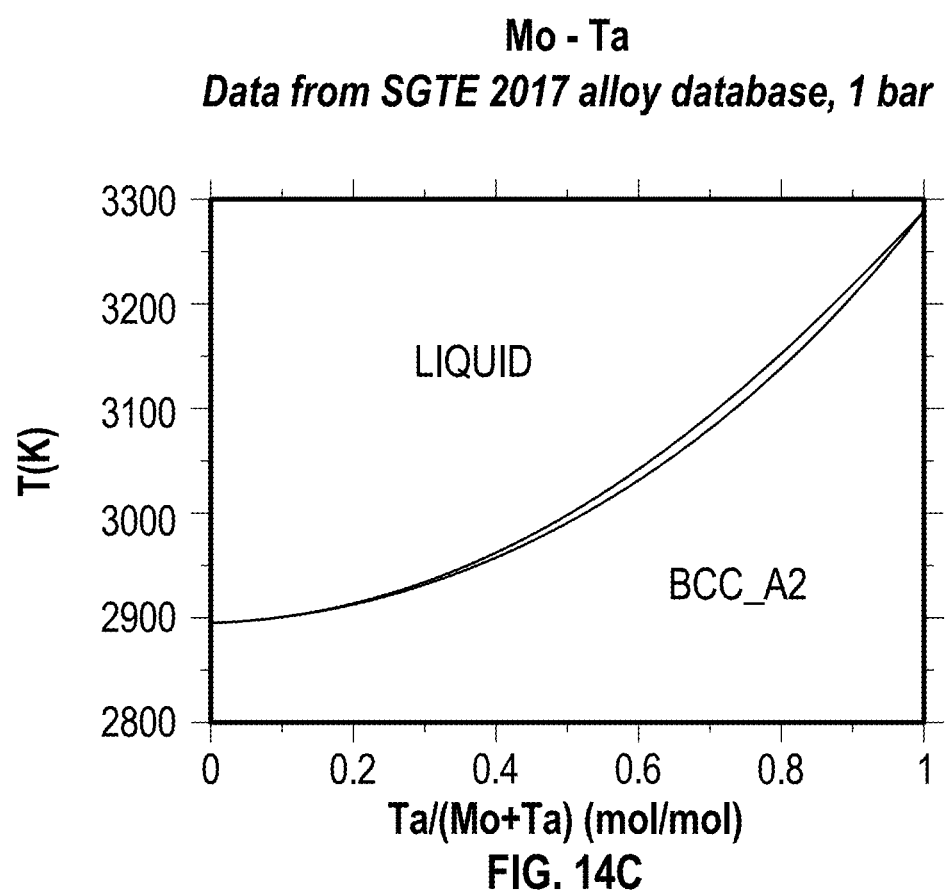
FIG. 14C depicts a tantalum-molybdenum (Ta—Mo) binary phase diagram in accordance with some embodiments of the present disclosure.
Figure 14D:
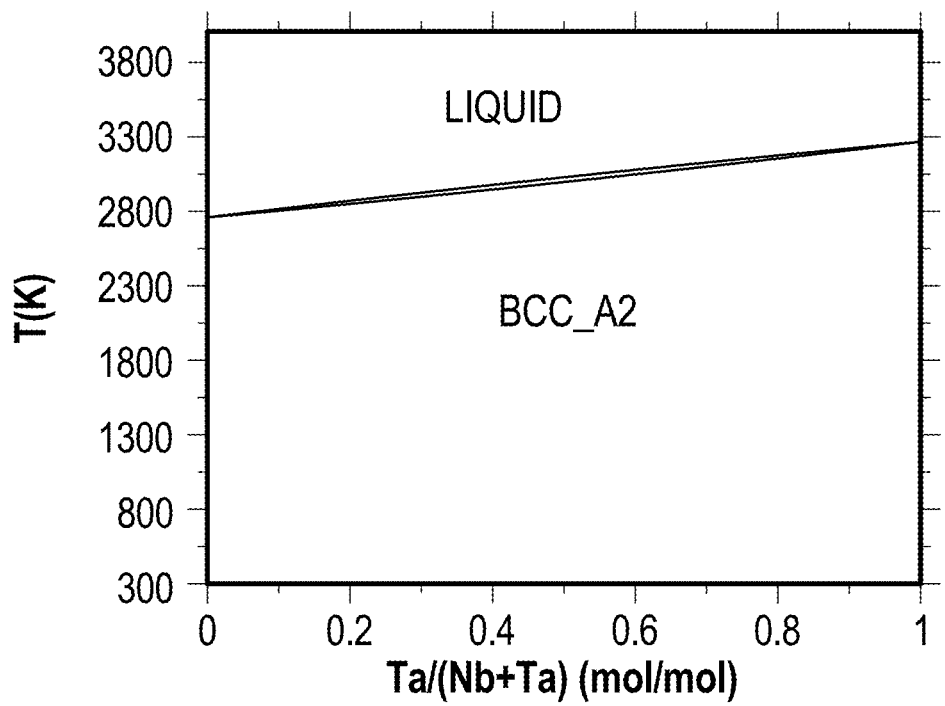
FIG. 14D depicts a tantalum-niobium (Ta—Nb) binary phase diagram in accordance with some embodiments of the present disclosure.
Figure 14E:
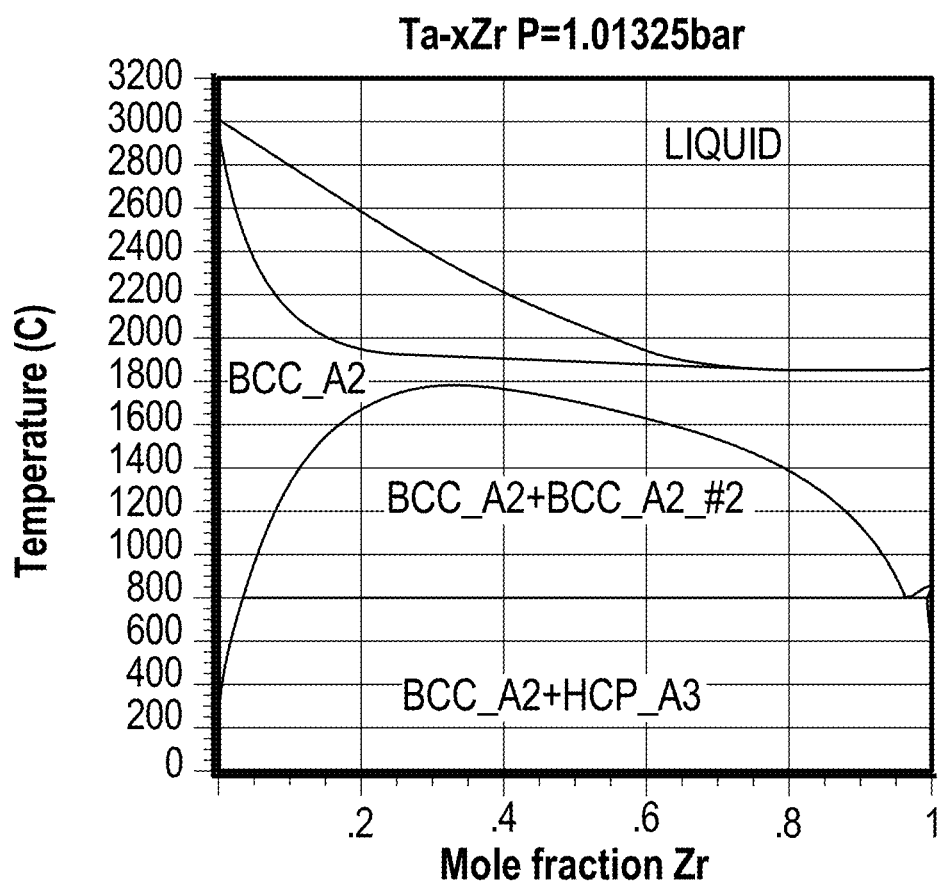
FIG. 14E depicts a tantalum-zirconium (Ta—Zr) binary phase diagram in accordance with some embodiments of the present disclosure.

FIG. 13 is a flow diagram illustrating an example 1300 of a method for fabricating a top electrode of an RRAM device according to some embodiments of the disclosure.

At block 1310, a first layer including a first metallic material may be fabricated. The first metallic material may include a first metallic element, such as Ti, Hf, and Zr. The first layer of the first metallic material may be fabricated by depositing a first metal (e.g., Ti metal) utilizing PVD, CVD, sputtering, ALD, and/or any other suitable deposition technique. Fabricating the first layer of the first metal may involve depositing a layer of the first metal with a suitable thickness, such as a thickness between about 0.2 nm and about 5 nm, a thickness between about 0.5 nm and about 2 nm, etc.

At block 1320, a second layer including a second metallic material may be fabricated. The second metallic material may include a second metallic element that is different from the first metallic element. For example, the second metallic element may be Ta. In some embodiments, fabricating the second layer including the second metallic material may involve depositing a second metal (e.g., Ta metal) utilizing PVD, CVD, sputtering, ALD, and/or any other suitable deposition technique. Fabricating the second layer of the second metal may involve depositing a layer of the second metal with a suitable thickness, such as a layer of the second metal that is thicker than that of the first layer of the first metal. In some embodiments, a layer of the second metal having a thickness between 10 nm and 100 nm may be deposited. In some embodiments, the second layer of the second metal may be deposited directly on the first layer of the first metal. In such embodiments, a surface of the first layer of the first metal may directly contact one or more portions of a surface of the second layer of the second metal.

In some embodiments, fabricating the second layer including the second metallic material may involve fabricating a layer including one or more alloys. As described above, each of the alloys may contain a first metallic element and one or more second metallic elements. Each of the second metallic elements may have different reactivity to the transition metal oxide in the switching oxide layer than the first metallic element. In some embodiments, the first metallic element may be Ta. The second metallic elements may be one or more of W, Hf, Mo, Nb, Zr, etc. Fabricating the second layer of the Ta alloy may involve depositing the Ta alloy utilizing PVD, CVD, sputtering, ALD, and/or any other suitable deposition technique. Fabricating the second layer of the Ta alloy may involve depositing a layer of the Ta alloy with a suitable thickness, such as a layer of the Ta alloy that is thicker than that of the first layer of the first metal. In some embodiments, a layer of one or more Ta alloys having a thickness between about 5 nm and about 100 nm may be deposited.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events.

The terms "approximately," "about," and "substantially" as used herein may mean within a range of normal tolerance in the art, such as within 2 standard deviations of the mean, within ±20% of a target dimension in some embodiments, within ±10% of a target dimension in some embodiments, within ±5% of a target dimension in some embodiments, within ±2% of a target dimension in some embodiments, within ±1% of a target dimension in some embodiments, and yet within ±0.1% of a target dimension in some embodiments. The terms "approximately" and "about" may include the target dimension. Unless specifically stated or obvious from context, all numerical values described herein are modified by the term "about."

As used herein, a range includes all the values within the range. For example, a range of 1 to 10 may include any number, combination of numbers, sub-range from the numbers of 1, 2, 3, 4, 5, 6, 7, 8, 9, and 10 and fractions thereof.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. A resistive random-access memory (RRAM) device, comprising:
    a first electrode;
    a first interface layer fabricated on the first electrode, wherein the first interface layer comprises a first discontinuous film of a first material;
    a switching oxide layer fabricated on the first interface layer, wherein the switching oxide layer comprises at least one transition metal oxide, and wherein the first material is more chemically stable than the at least one transition metal oxide;
    a second electrode fabricated on the switching oxide layer, wherein the second electrode comprises:
        a first layer comprising a first metallic material; and
        a second layer comprising a second metallic material, wherein the second layer is fabricated on the first layer comprising the first metallic material; and
    a second interface layer positioned between the switching oxide layer and the second electrode, wherein the second interface layer comprises a second discontinuous film of a second material, wherein the second material is more chemically stable than the at least one transition metal oxide, and wherein at least a portion of the first layer comprising the first metallic material is deposited on the switching oxide layer through the second discontinuous film of the second material.

2. The RRAM device of claim 1, wherein the at least one transition metal oxide comprises at least one of $HfO_x$ or $TaO_y$, wherein $x \leq 2.0$, and wherein $y \leq 2.5$.

3. The RRAM device of claim 1, wherein the first material comprises at least one of $Al_2O_3$, $MgO$, $Y_2O_3$, or $La_2O_3$.

4. The RRAM device of claim 1, wherein the first discontinuous film of the first material comprises one or more first pores, and wherein the switching oxide layer contacts one or more portions of the first electrode through at least one of the first pores.

5. The RRAM device of claim 1, wherein a thickness of the first interface layer is between 0.2 nm and 1 nm.

6. The RRAM device of claim 1, wherein the second electrode comprises an alloy of tantalum.

7. The RRAM device of claim 6, wherein the alloy of tantalum further comprises at least one of hafnium, molybdenum, tungsten, niobium, or zirconium.

8. The RRAM device of claim 7, wherein the alloy of tantalum comprises at least one of a binary alloy comprising tantalum, a ternary alloy comprising tantalum, a quaternary alloy comprising tantalum, a quinary alloy comprising tantalum, a senary alloy comprising tantalum, or a high order alloy comprising tantalum.

9. The RRAM device of claim 1,
    wherein the first layer comprising the first metallic material is thinner than the second layer comprising the second metallic material.

10. The RRAM device of claim 1, wherein the second electrode contacts at least a portion of the switching oxide layer.

11. The RRAM device of claim 10, wherein the second material comprises at least one of $Al_2O_3$, $MgO$, $Y_2O_3$, or $La_2O_3$.

12. The RRAM device of claim 1, wherein a thickness of the second interface layer is between 0.2 nm and 1 nm.

13. The RRAM device of claim 1, wherein the first layer comprising the first metallic material comprises a layer of a metal, and wherein at least a portion of layer of the metal is deposited on the switching oxide layer through the second discontinuous film of the second material.

14. The RRAM device of claim 13, wherein the first material is more chemically stable than an oxide of the first metallic material, and wherein the oxide of the first metallic material is more chemically stable than the at least one transition metal oxide.

15. The RRAM device of claim 13, wherein the metal comprises at least one of Ti, Hf, or Zr.

16. The RRAM device of claim 15, wherein the second metallic material in the second electrode comprises tantalum.

17. The RRAM device of claim 13, wherein a thickness of the first layer comprising the first metallic material is between 0.2 nm and 5 nm.

* * * * *